United States Patent [19]
Fridman

[11] Patent Number: 4,659,004
[45] Date of Patent: Apr. 21, 1987

[54] DEVICE FOR ATTACHING MODULAR ELECTRONIC COMPONENTS TO OR REMOVING THEM FROM AN INSULATIVE DEVICE

[75] Inventor: Robert Fridman, Randallstown, Md.

[73] Assignee: Pace, Incorporated, Laurel, Md.

[21] Appl. No.: 649,065

[22] Filed: Sep. 10, 1984

Related U.S. Application Data

[63] Continuation-in-part of Ser. No. 583,218, Feb. 24, 1984.

[51] Int. Cl.⁴ .............................................. B23K 3/00
[52] U.S. Cl. ........................................ 228/6.2; 228/8;
228/9; 228/49.1; 228/56.5; 81/448
[58] Field of Search ............... 228/6.2, 180.2, 240,
228/242, 49.1, 56.5, 9-11, 105, 8, 12, 264;
219/379-381, 374; 294/64.1; 285/268; 81/448, 449

[56] References Cited

U.S. PATENT DOCUMENTS

| | | | |
|---|---|---|---|
| 2,745,451 | 5/1956 | Neil | 81/449 |
| 3,356,830 | 12/1967 | Schleer et al. | 228/242 |
| 3,869,242 | 3/1975 | Schladitz | 219/381 |
| 4,021,068 | 5/1977 | Piazza | 294/64.1 |
| 4,151,945 | 5/1979 | Ragard et al. | 228/6.2 |
| 4,295,596 | 10/1981 | Doten et al. | 228/242 |
| 4,426,571 | 1/1984 | Beck | 228/264 |
| 4,561,584 | 12/1985 | Hug | 228/264 |
| 4,569,473 | 2/1986 | Guiliano | 228/264 |

FOREIGN PATENT DOCUMENTS

| | | | |
|---|---|---|---|
| 139381 | 11/1950 | Australia | 81/448 |
| 16368 | 10/1980 | European Pat. Off. | 228/6.2 |
| 108124 | 8/1943 | Sweden | 81/448 |

Primary Examiner—Nicholas P. Godici
Assistant Examiner—Samuel M. Heinrich
Attorney, Agent, or Firm—Gerald J. Ferguson, Jr.; Michael P. Hoffman; Ronni S. Malamud

[57] ABSTRACT

A device is disclosed for attaching to or removing modular electronic components from a substrate which is adjustably positioned beneath a heater means delivering a flow of uniformly heated air. The heated air is directed to the sides of the component to melt solder associated with terminals thereon by a series of changeable nozzles which can be moved into or out of registry with the component. Vacuum means is also provided for contacting the component to position it on or remove it from the substrate.

31 Claims, 30 Drawing Figures

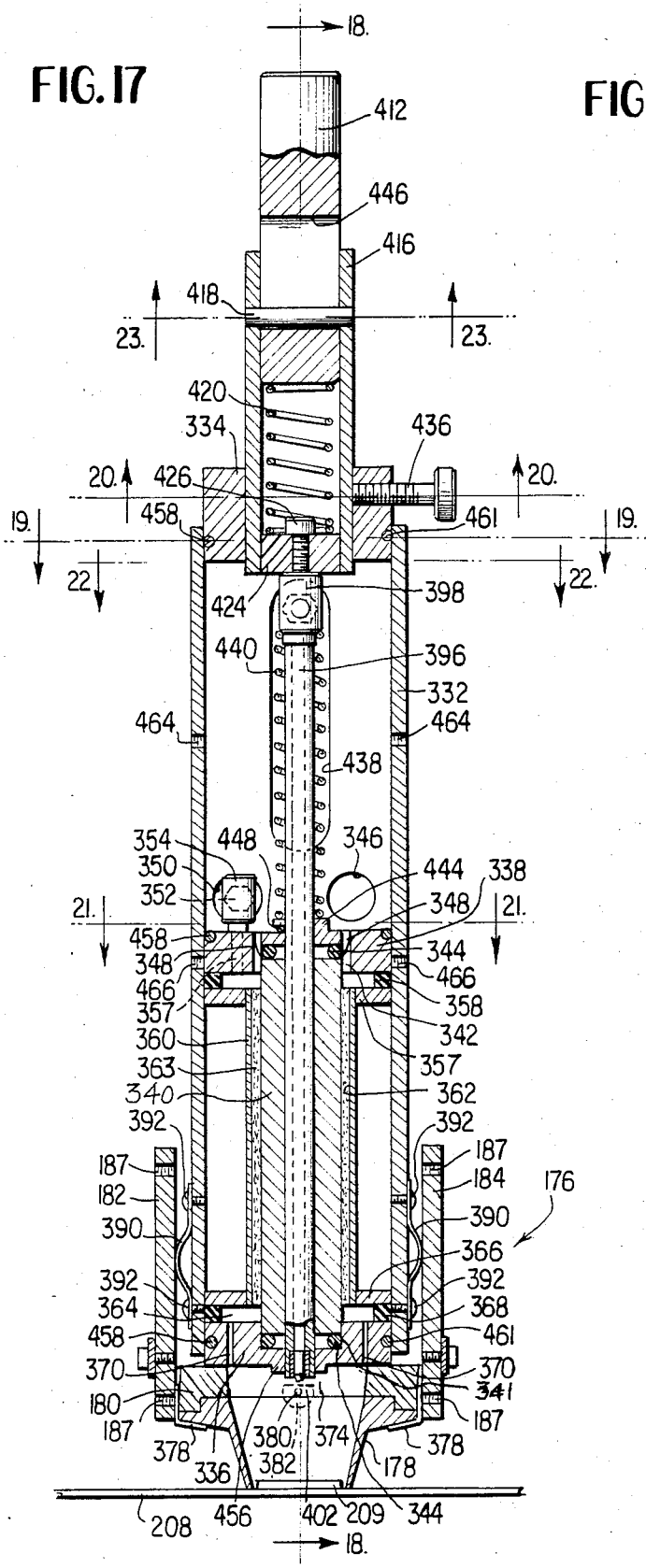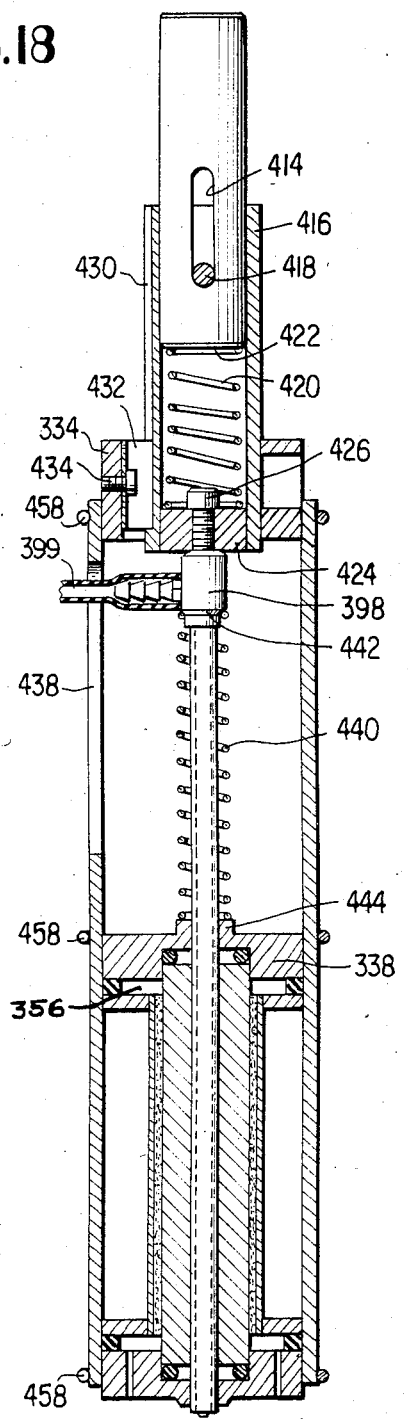

DEVICE FOR ATTACHING MODULAR ELECTRONIC COMPONENTS TO OR REMOVING THEM FROM AN INSULATIVE DEVICE

CROSS-REFERENCE TO RELATED APPLICATIONS

This application is a continuation-in-part of application Ser. No. 583,218 filed Feb. 24, 1984.

This application is also related to application Ser. No. 492,989 filed May 9, 1984 and Ser. No. 595,606 filed Apr. 2, 1984, both of these applications being assigned to the assignee of the subject application and incorporated by reference herein.

BACKGROUND OF THE INVENTION

This invention relates to heating devices and more particularly to a device for attaching modular electronic components to or removing them from a substrate such as a printed circuit board.

Present day devices for removing or installing modular electronic components from a substrate such as a printed circuit board generally fall into two categories: those which use a heated head which contacts each terminal to melt the solder thereon or those which use a blast of hot air to melt the solder. The former devices are generally very complex and employ a heated head having a plurality of spaced apart fingers each of which must be precisely aligned with each terminal around the component to simultaneously heat the solder on it. The component is then withdrawn from the substrate by vacuum suction or other mechanical means. The procedure is reversed for installing a component. An example of such a device is disclosed in U.S. Pat. No. 3,382,564. A major disadvantage of this type of device is that, due to the everincreasing miniaturization of electronic systems and individual components in them, the terminals of such components are extremely close together thus making precise alignment of the fingers of the heating head therewith extremely difficult. Improper alignment or contact often results in solder flowing between terminals on the component thus shorting them or otherwise damaging them. The latter devices direct a blast of hot air at the terminals from a source above the component to simultaneously melt the solder on each. Such a device, for example, is set forth in U.S. Pat. No. 4,366,925. Such a device may function satisfactorily if there is a large spacing between components such that the blast of hot air directed at one component from above will not spill over and melt the solder on the terminals of adjacent components. However, as aforementioned, not only are the components themselves becoming increasingly smaller but their proximity on the printed circuit substrate is also increasing. Thus, there is a need for a device which cannot only provide a closely controlled and evenly distributed source of heat sufficient to melt solder associated with component terminals or printed substrate conductors during installation or removal of the electronic component relative thereto but one which can rapidly and precisely direct this controlled heat where desired thereby minimizing the likelihood of melting the solder on the terminals of adjacent components or otherwise damaging the printed conductors on the substrate. There is also a need for a device of the subject type which has the capability of precisely positioning the electronic component and its terminals on the ends of the printed conductors on the substrate to insure no overlapping as well as removing the component to insure that no liquid solder is smeared on the substrate between the conductors printed thereon.

It is therefore the primary object of the present invention to provide a superior device for installation and removal of electronic components from circuits printed on a substrate.

It is another object of the present invention to provide a device of the subject type which employs a series of stacked nozzles for precisely directing the flow of hot air from a source simultaneously to the solder associated with each component terminal or printed conductor on the substrate.

It is yet another object of the present invention to provide a device wherein the aforementioned nozzles can be both rapidly changed to correspond to the different size of various electronic components as well as moved separately or together to a location to permit cleaning or other preparation of the substrate without shutting off the source of heated air.

It is a further object of the present invention to provide a device which has means for rapidly and accurately positioning the substrate and the electronic component to be installed or removed beneath the source of heated air.

It is a still further object of the present invention to provide a device which has a vacuum means axially aligned with the source of heated air and directing nozzles for positioning the electronic component on or removing it from the substrate.

It is a further object of this invention to provide in a device of the above type, means such as steel wool provided in the heater air passageway to facilitate the transfer of heat to the passing air.

It is a further object of the present invention to provide, in a device of the above-type, a mechanism for efficiently moving a component removal/installation unit between its operative and inoperative positions, this being effected by rotation of the unit through about 90° in a vertical plane such that the initial movement from the printed circuit board is substantially vertical while the final movement to the inoperative position is substantially horizontal.

It is a further object of this invention to provide, in a device of the above-type, improved means for removing a nozzle location device from a heater unit of the above component removal/installation unit.

It is a further object of the present invention to provide, in a device of the above-type, means for maintaining the component removal/installation unit in a substantially vertical alignment as it is rotated between operative and inoperative positions.

It is a further object to provide, in a device of the above-type, means for effectively separating a vacuum device from a semiconductor module upon removal of the vacuum.

It is a further object of this invention to provide a flexible key arrangement for guiding the sliding movement of members with respect to one another such that the need for close tolerances in the key arrangement is avoided.

It is a further object of the present invention to provide, in a device of the above-type, resilient means for biasing a sliding member with respect to a fixed member whereby the need for close tolerances between the latter members is avoided.

It is a further object of the present invention to provide in a device of the above-type, means for accurately positioning a new module to be installed with respect to the component removal/installation device.

It is a further object of this invention to provide, in a device of the above-type, the capability of handling both leadless chip carriers and flat-pac carriers.

BRIEF DESCRIPTION OF THE DRAWING

Other objects, details and advantages of the invention will be more readily apparent in the light of the explanation which follows of a preferred embodiment of a device according to the invention, given only by way of example and with references to the accompanying drawing in which:

FIG. 17 is a cross-sectional view of the component removal/installation unit 172 of FIG. 11.;

FIGS. 18 through 23 are cross-sectional views taken respectively along the lines 18—18, 19—19, 20—20, 21—21, 22—22, and 23—23 of FIG. 17;

DESCRIPTION OF PREFERRED EMBODIMENT

Figure 1:
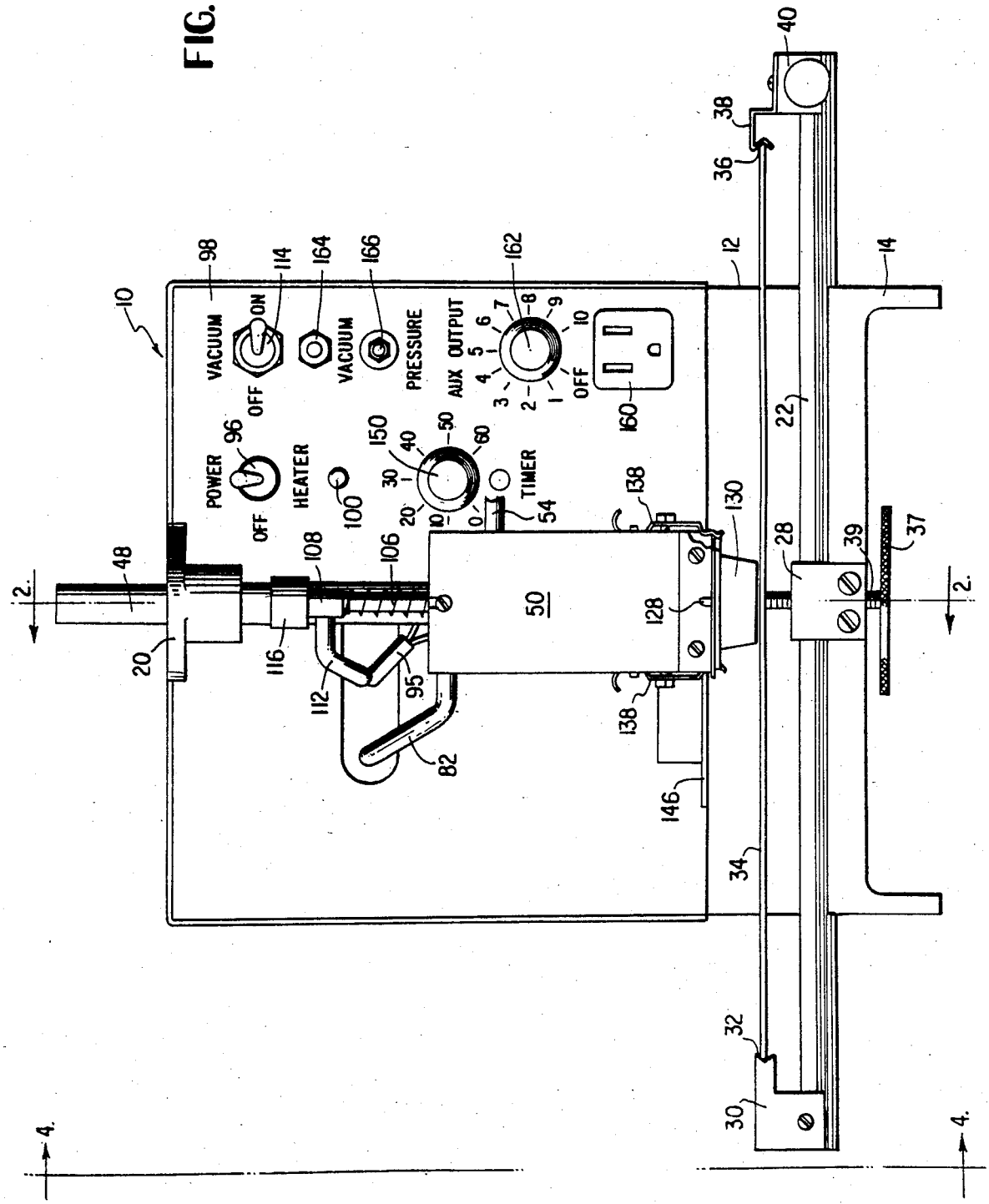
FIG. 1 is a front elevational view of the device of the subject invention.

Referring now to the drawings where like characters of reference refer to similar elements in each of the several views, numeral 10 indicates generally the device of the present invention for attaching modular electronic components to or removing them from an insulative substrate.

More specifically, referring to FIGS. 1-4, the device 10 comprises a main frame element 22 having a base section 14, a mounting section 16 parallel to the base section 14, a vertical section 18 and a top mounting arm 20 extending from the vertical section 18 parallel to the base section 14. A rectangular shaped rod 22 is slidably mounted between a groove 24 in the base section 14 and a groove 26 in a clamp 28 secured to the base 14. A fixed block 30 is secured at one end of the rod 22 and has a V-shaped recess 32 formed therein for supporting an edge of a substrate or printed circuit board 34 as it is often called. The opposite edge of the substrate 34 is supported in a similar shaped recess 36 of a spring clip 38. The spring clip 38 in turn is secured to a block 40 which is slidable on the other end of the rod 22. A knob 37 having a shaft 39 in threaded engagement with base section 14 is provided which can be rotated into engagement with the underside of the substrate 34 to support the middle of same. The substrate 34 generally has a plurality of electronic components 42 positioned thereon which have connection terminals 44 extending around the periphery thereof (see FIG. 9). The terminals 44 are soldered to conductors 46 of an interconnection network on the top surface as well as between various layers of the substrate which is typically made of an insulative, ceramic material. The electronic component 42 can thus be positioned in one direction by moving the substrate 34 in recesses 32, 36 and in a direction ninety-degrees relative to that direction by sliding the rod 22 in the grooves 24, 26. A shaft 48 is secured at one of its ends to the top mounting arm 20 and extends downward toward the base section 14.

Figure 5:
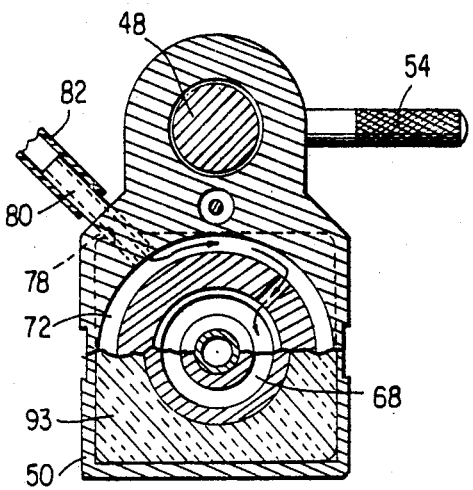
FIG. 5 is a cross-sectional view of the heater assembly taken along the line 5—5 of FIG. 2.
Figure 6:
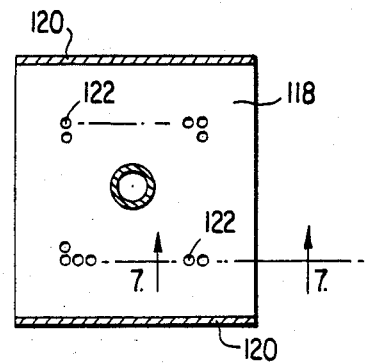
FIG. 6 is a view in partial cross-section of a nozzle taken along the line 6—6 of FIG. 2.
Figure 7:
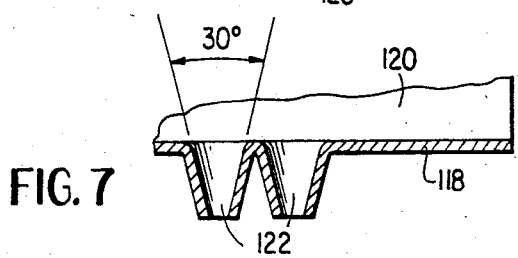
FIG. 7 is an enlarged cross-sectional view taken along the line 7—7 of FIG. 6.
Figure 8:
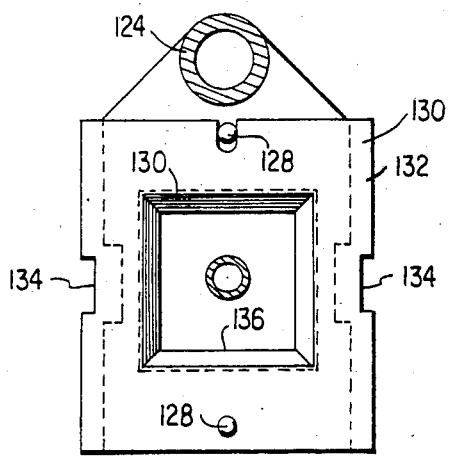
FIG. 8 is a view of the locator nozzle taken along the line 8—8 of FIG. 2.

An assembly 50 for heating the solder associated with the terminals 44 and conductor 46 of the electronic component 42 and lifting it from the substrate 34 is mounted for vertical as well as horizontal movement on the shaft 48. The assembly 50 comprises a mounting block 52 which is journaled on the shaft 48 and can be rotated to a position shown by phantom lines in FIG. 3 or raised and lowered by means of handle 54. The mounting block 52 has a cylindrical shaped cavity 56 formed therein and an inward, radially extending lip 58 which terminates at passageway 60 that connects an upper chamber 62 with a lower chamber 64. A heating element 66 of the electrical resistance type is positioned in the upper chamber 62 on the lip 58. The heating element 66 is cylindrical in shape and has a plurality of throughpassages 68 extending the length thereof for heating air passing through as will be more fully described later. A plug 70 is provided in the mounting block 52 to enclose the end of the upper chamber 62. The plug 70 has a circumferential recess 72 from which inlet ports 74 extend inwardly to an opening 76. A base 78 through the mounting block 52 communicates at one end with the recess 72 and is connected at the other end to a tube 80 as best be seen in FIG. 5. Air under pressure is delivered to the tube 80 by hose 82 from a source 84 which consists of a pneumatic pump secured to the mounting section 16 and enclosed by housing 85. The pump 84 has a pressure side 86 and a vacuum side 88 with filters 90. The electric motor (not shown) of the pump 84 has one end 92 of its shaft exposed. A flexible drive shaft (also not shown) can be connected to shaft 92 to power small hand-held drills, wire wheels and the like to perform minor repair and cleaning operations on the substrate 34. The remainder of the upper chamber 62 is filled with an insulating material 93 to prevent dissipation of heat from the heating element 66 and maximize heating of the air traveling in through passages 68. A heat sensing element 94 in the form of a thermistor is located in the lower chamber 64 to sense the temperature of the air passing therethrough to thereby control the energization of the heating element 66 to maintain it at a preselected level. Energization of the heating element circuit (not shown) is controlled by switch 96 located on control panel 98. A light 100 is also provided to indicate when the heating element 66 is in operation. Wires from the thermistor 94 and heating element 66 are carried in flexible conduit 95.

Figure 2:
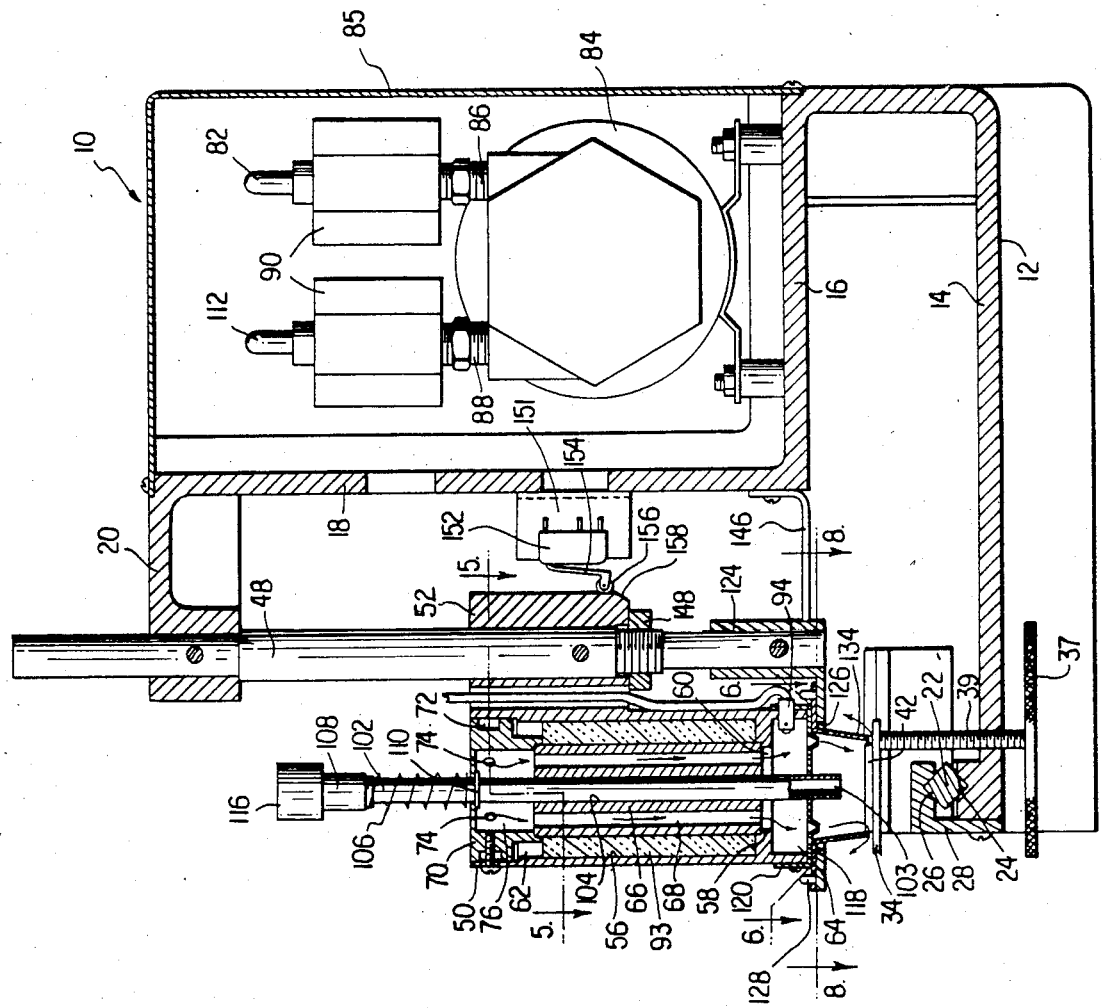
FIG. 2 is a side elevational view in partial cross-section taken along the line 2—2 of FIG. 1.
Figure 3:
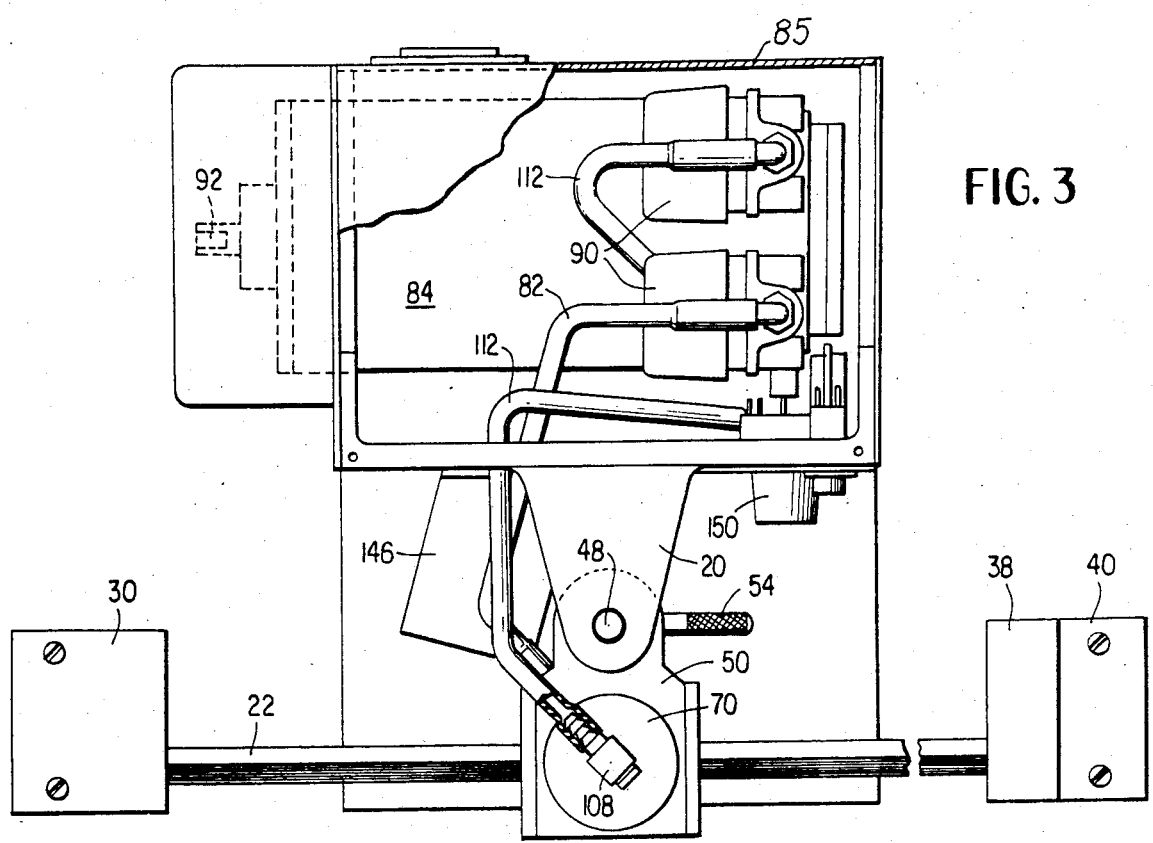
FIG. 3 is a plan view of the device shown in FIG. 1.
Figure 4:
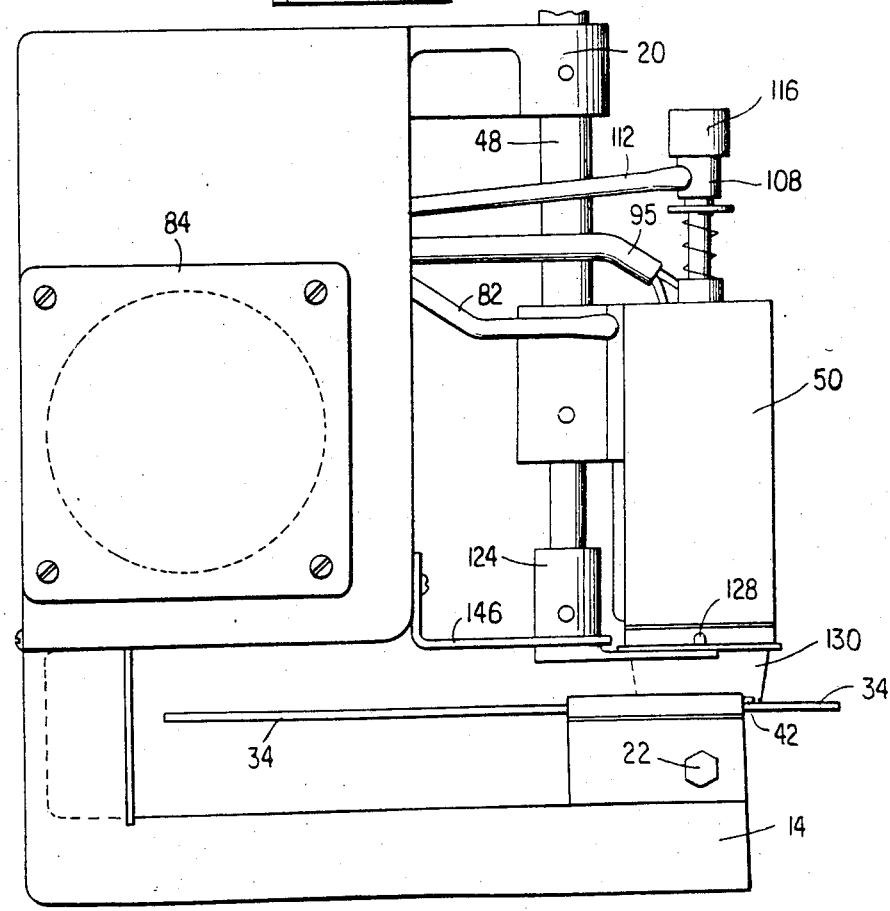
FIG. 4 is a side elevational view taken along line 4—4 of FIG. 1.

An elongated vacuum tube 102 is slidably mounted in the plug 70 and extends through a bore 104 in the heating element 66, through the lower chamber 64 to a first position shown in FIG. 2. The vacuum tube is maintained in this first position by means of a compression spring 106 acting between the plug 70 and fitting 108 on the upper end thereof. A retainer ring 110 is provided to limit upward travel of the vacuum tube 102. The vacuum tube 102 is also connected by a hose 112 secured at one end to the fitting 108 and the other end to the vacuum side 86 of the pump 84 by way of a vacuum control valve 114 located on the panel 98. Actuation of the vacuum control valve 114 by pressing on button 116 causes a vacuum to be created in the vacuum tube 102 and at the end 103 thereof for removing an electronic component 42 as will be more fully described later.

Referring now to FIGS, 2, 6, 7 and 8, a nozzle plate 118 is secured by side flanges 120 to the opening in the mounting block 52 adjacent the lower chamber 64. The nozzle plate 118 has a plurality of nozzle orifices 122 formed therethrough which have sides tapered at an angle of approximately 30 degrees with respect to each other. The orifices 122 are arranged in a rectangular shape which generally corresponds to the shape of the outer perimeter of the electronic component 42. A holder 124 is also mounted on the shaft 48 and it is capable of vertical as well as horizontal (rotational) movement as is the block 52. The holder 124 has a rectangular shaped opening 126 adjacent to which are two oppositely disposed guide pins 128. A locator nozzle 130 has a base 132 and a flanged portion 132 which is inserted in the opening 126 and retained by guide pins 128. The base 132 has notches 134 the function of which will be described shortly. The flanged portion 132 has an opening 136 which is the same shape but is slightly larger than the perimeter of the electronic component 42. With the assembly 50 raised and rotated out of the way, the electronic component 42 can be viewed through the opening 136 from above and positioned so that it is equidistant or centered within the opening 136.

Figure 9:
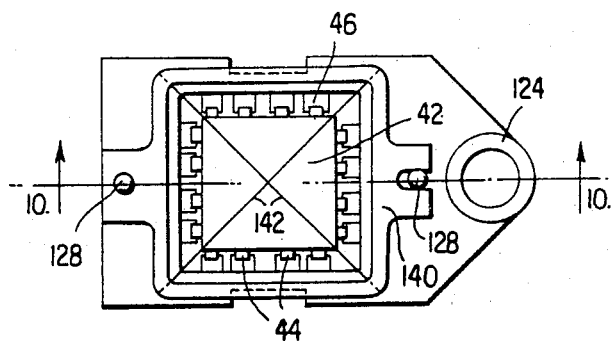
FIG. 9 is a plan view of the holder assembly with a chip located in position.
Figure 10:
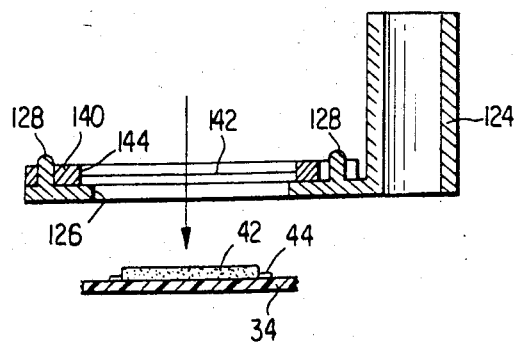
FIG. 10 is a cross-sectional view taken along the line 10—10 of FIG. 9.

The locator nozzle 130 can be attached to the assembly 50 and rotated out of the way therewith by means of clips 138 which engages the notches 134 as best seen in the cut away view shown in FIG. 1. With the locator nozzle 130 rotated out of the way, an aligning plate 140 can be installed on the guide pins 128 as shown in FIGS. 9 and 10. The aligning plate 140 has wires 142 crossed at 90 degrees with respect to each other and secured in the corners of the opening 144. Thus, when the corners of the electronic component 42 are each beneath one of the wires 142, the component is precisely centered in the opening 144. After the electronic components 42 is centered, the plate 140 is removed and the assembly 50 together with locator nozzle 130 is returned for removal or installation of the component as will be fully described with the explanation of the operation of the device. A platform 146 is secured to the vertical section 18 and extends outwardly therefrom. The platform 146 acts to shield the substrate 34 and electronic components 42 thereon from the heated air emmanating from opening 136 when the assembly 50 is in the rotated position. In order to accurately position the opening 136 of the locator nozzle 130 a predetermined distance above the substrate 34, a nut 148 is provided threaded on the shaft 48 which can be raised and lowered by rotation to thereby limit downward travel of the mounting block 52 and locator nozzle clipped thereto.

A timer 150 is located on the panel 98 which can be set to provide an audible alarm when the set time limit has expired. The operation of the timer is started by closure of a microswitch 152 mounted by a bracket 153 having an actuating arm 154 and roller 156 thereon. A cam surface 158 on the mounting block 52 is engaged by the roller 156 to operate the switch 152 when the assembly 50 is lowered into operating position.

An electrical outlet 160 is also provided on the panel 98 into which can be plugged various auxiliary devices such as a hand held desoldering and vacuum solder removing device (not shown) for cleaning and repair work.

The degree of energization of the device 160 and thus its temperature can be adjusted by controller 162. A source of vacuum 164 is also located on the panel 98 as is a source of air under pressure 166 for blowing debris from the substrate 34 to assist in cleaning it.

OPERATION

Energization of the heater element 66 by actuation of switch 96 also starts pump 84 to provide both a source of air under pressure as well as a source of vacuum. With the vacuum in tube 102 shut off by control valve 114, a locator nozzle 130 is selected having an opening 136 slightly larger than the perimeter of the electronic component to be installed or removed and this is clipped onto the mounting block 52. The entire assembly 50 and locator nozzle 130 are then rotated and lowered to a position where the platform 146 covers the opening 136 to thereby prevent hot gas from damaging the substrate 34.

If the electronic component 42 is to be removed from the substrate 34, the aligning plate 140 is positioned on the holder 124 and the component is aligned beneath the crosswires 142 by sliding the substrate in the grooves 32, 36 and positioning it by moving rod 22. After the electronic component 42 is aligned, the aligning plate 140 is removed and the assembly 50 rotated such that the locator nozzle 130 is above the opening 126 in the holder 124. A time sufficient to insure proper melting of the connecting solder is selected on timer 150 and the assembly 50 and locator nozzle 124 are lowered to a position above the terminals 44 on the electonic component 42 as preselected by the location of nut 148. At this location, the opening 136 of the locator nozzle 130 is spaced apart a short distance from the substrate 34 which is just sufficient to permit the heated air to escape out. Lowering of the assembly 50 caused energization of the timer by switch 152. During this period, air under pressure from the pump 84 flows through the bore 78 into recess 72 and from there through inlet ports 74 into opening 76 above the heating element 66. As the air flows downward (see arrows) in through passages 68 it is heated to a preselected solder melting temperature. The air thus heated exits through passages 68 into the lower chamber 64 and from there through nozzle orifices 122 where it is converted into a plurality of jet streams. These jet streams are then guided by the wall of locator nozzle 130 to the opening thereof 136. As the heated air exits the opening 136 it heats the solder between the terminals 44 and conductors 46 thus melting the solder and freeing electronic component 42 which should coincide with expiration of the time on the timer 150 as indicated, for example, by an audible signal. At this time, the vacuum control valve 114 is actuated causing a vacuum in tube 102 and at the end 103 thereof.

Manual downward pressure on the button 116 causes the end 103 to engage the electronic component 42 which will then adhere to the end 103 as the tube returns to its rest position. The assembly 50 and locator nozzle 130 are then raised, rotated and lowered onto platform 146. The holder 124 can also be rotated with the assembly 50 at this time to clear the area above the site.

After the site has been cleaned and prepared by the auxiliary equipment aforementioned, a new electronic component can be positioned on the conductors 46 by the aligning plate 140 on holder 124 and soldered thereto by again lowering the assembly 50 and locator nozzle 130 adjacent thereto for a timed period.

Figure 11:
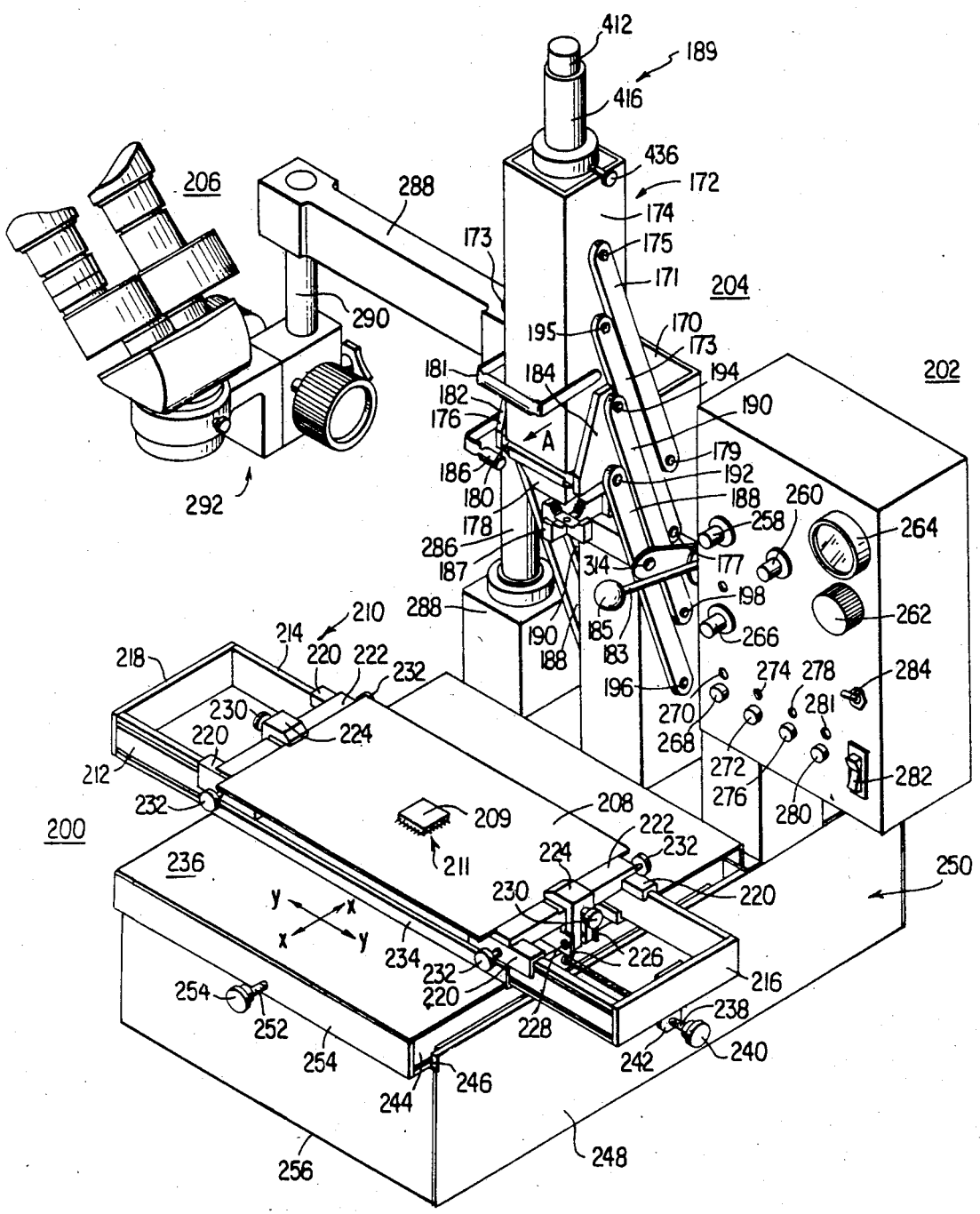
FIG. 11 is a perspective view of an illustrative system for removing electronic components from a printed circuit board or the like or installing such components on the board.

Reference should now be made to FIGS. 11 through 30 for a further embodiment of the invention where as shown in FIG. 11 there is included a workpiece manipulating unit 200, a control unit 202, a component removal/installation unit 204, and a microscope unit 206. Unit 200 is adapted to receive a printed circuit board 208. Generally the board will have mounted thereon a number of semiconductor components or modules, one of which is indicated at 209 where each module includes a plurality of terminals 211. The board is held in place by a retaining member generally indicated at 210. Unit 210 includes a pair of rails 212,214 connected together at the ends thereof by plates 216 and 218. Slidably mounted on rails 212,214 are slides 220. Connecting slides 220 are bars 222. Pivotally mounted with respect to bars 222 are clamps 224 for clamping board 208 with respect to bars 222. Mounted on each of the bars 222 are a pair of brackets 226. Disposed between each bracket pair is a pivot pin 228 for pivotally mounting clamp 224. Locking screws 230 are provided with knurled knobs and threaded through clamps 224 to engage bars 222 to thus lock clamps 224 in place once board 208 has been appropriately positioned between the clamps. Locking screws 232 also having knurled knobs are threaded through slides 222 to engage rails 212 and 214 to lock the board 208 with respect to the rails. The rails 212,214 are slidably mounted in a pair of guides 234 which are fixedly mounted on a movable plate 236.

Fine positional adjustment is provided by an adjusting screw 238 having a knurled knob 240, screw 238 being threaded through a bracket 242 connected to plate 216 and a side wall 244 of mounting plate 236. Hence, by rotation of screw 238, the board mounting member 210 can be longitudinally positioned along guides 234 to effect fine positioning in a first direction.

Fine positioning in the direction perpendicular to the first direction is effected in the following manner. Movable mounting plate 236 is slidably mounted in a pair of guides 246 provided at the upper inside surfaces of the side walls 248 of a stationary base member generally indicated at 250. Movable mounting plate 236 may be slid along guides 246 by adjusting screw 252 having knurled knob 254, the screw being threaded through a front wall 254 of the mounting plate and through the front wall 256 of base member 250.

It should be noted module 209, as illustrated in FIG. 11, corresponds to a module generally known as a flat-pac carrier where the terminals 211 are flexible and extend outwardly from the main body of the module. The present invention may be used not only with this type module but also with one known as a leadless chip barrier (LCC), as will be described in further detail hereinafter. Typically the terminals of an LCC module do not extend outwardly from the body, but are disposed on the underside thereof around the periphery.

Control unit 202 includes a control knob 258, the purpose of which is to control the amount of time heated air is applied to the terminals to be soldered or desoldered. Control knob 260 is connected to a control circuit, described in more detail hereafter with respect to FIG. 30, which controls the current through the heater to thus control the temperature thereof. Control knob 262 controls the pressure of the air delivered to the unit while a gauge 264 indicates the air pressure level. A control knob 266 controls a pre-heater temperature. Although not shown, the pre-heater is disposed beneath the board 208 and may be employed for pre-heating, for example, of a component to be removed. Push button 268 starts the main heater and, in particular, the application of current to the heater from the heater control circuit. Once the heater reaches the level corresponding to the temperature set at knob 260, the temperature will be maintained at that level. Furthermore, a predetermined time after button 268 is pushed (typically 25 seconds), air will start to flow from a pump such as pump 84, through the heater, it being assumed after the predetermined time the heater will reach the temperature set at knob 260. The duration of the applied heated air corresponds to the time set at knob 258. After the heated air has been applied for this time, a light 270 starts to flash thereby indicating to the operator vacuum should either be (a) applied to the component if it is being removed or (b) removed therefrom if it is being installed. A push button 272 is employed to cut off current flow to the heater. Light 274, when on, indicates the heater is actuated. Button 276, when actuated, causes air under pressure to be applied to the component. Light 278, when on, indicates air is being applied to the component. Button 280, when actuated, starts vacuum flow and when actuated again stops vacuum flow. Light 281 indicates the vacuum is being applied. Switch 282 turns the system on and off while switch 284 is employed if a gas other than air is to be employed. In one position of this switch air is employed and in the other, another gas may be employed.

Component removal/installation unit 204 includes a support column 170 upon which is pivotally mounted a component removal/installation device generally indicated at 172. Generally, unit 172 corresponds to assembly 50 of the embodiment of FIGS. 1 through 10 in that the unit is adapted to direct heated air to terminals 211 to be soldered to or removed from the printed circuit board or the like. Furthermore, unit 172 is adapted to receive a vacuum for manipulating the semiconductor module or component to be removed from or installed on the board.

The details of unit 172 will be described in further detail hereinafter with respect to FIGS. 17 through 26. Generally, unit 172 comprises two separable parts comprising a heater unit 174 and a nozzle locator unit 176, the purpose of the heater unit being to apply heated air to the terminals of the semiconductor module and vacuum thereto for manipulation purposes and the purpose of the nozzle locator unit 176 being to accurately locate the heater unit 174 with respect to the semiconductor module. As will be brought out in more detail hereinafter, the nozzle locator unit 176 is separable from the heater 174 in the direction of the arrow A shown in FIG. 11. In general, the nozzle locator unit includes an inwardly flared nozzle locator 178 which is removably mounted on a support plate 180 having two mounting plates 182 and 184 disposed at opposite sides of support member 180. The plates 182 and 184 are removably attached to the side walls of heater unit 174 by means which will be described below whereby the nozzle locator unit can be separated from heater unit 174 by simply pulling on a handle 186 attached to plate 182 in the direction of arrow A. Plates 182 and 184 are pivotally connected to mounting column 170 by arms 188 and 190 where a pivotal connection is made between plates 182 and 184 and arms 188 and 190 at pins 192 and 194. Pivotal connections between arms 188 and 190 and support column 170 are also made at 196 and 198. Thus, nozzle locator unit 176 can be positioned directly over module 209 by rotating it from its inoperative position shown in FIG. 11 to its position over the module, such that the relationship between the nozzle locator 178 and module 209 corresponds generally to that illustrated in FIGS. 9 and 10. The module may then be accurately positioned beneath the nozzle locator member in a manner to be described in more detail hereinafter.

Once the module 209 is accurately positioned with respect to the nozzle locator 176, the module will also be accurately located with respect to component removal/installation unit 172 upon subsequent positioning of unit 172 over the module. Nozzle locator unit 176 may now be raised from the module 209 by simply pulling up on handle 186 whereby unit 176 is rotated in the vertical plane passing through the module 209 and support column 170 back to its rest position shown in FIG. 11. At the end of its travel, unit 176 is snapped back into place on the sides of heater unit 174. The entire unit 172 may now be lowered over module 209 to effect removal thereof from board 208. This is effected by the pivotal connection of not only arms 188 and 190 to nozzle locator unit 176, but also the pivotal connection of arms 171 and 173 to the side walls of heater unit 174. Pins 175 and 195 pivotally connect arms 171 and 173 to the side walls of device 174. There are also pins 177 and 179 which pivotally connect arms 171 and 173 to the side wall of support column 170. A handle 181 is attached to the side walls of devices 174 and when pulled, the entire unit 172 including its component parts (that is heater unit 174 and locator 176) is pivoted from the position shown in FIG. 11 to a position over module 209 where the latter position will be accurately established due to the preliminary nozzle location step described above.

It should be noted the movement of unit 172 (or nozzle locator unit 176 when only this unit is moved) is through about one-quarter of a circle and thus the movement away from or toward the position shown in FIG. 11 is initially essentially horizontal while the movement away from or toward the module 209 is initially essentially vertical. This latter feature is particularly important for a number of reasons. For example, when the nozzle locator unit 176 is separated from and then subsequently reattached to heater unit 174, this separation and reattachment is efficiently accomplished due to the horizontal movement of the locator unit away from and toward unit 174. Moreover, when the locator unit is positioned above module 209, it is typically clamped in a position about one-quarter to one-half inch above the component, this being effected by a clamping member generally indicated at 183 having a knob 185. Positioning of component 209 with respect to nozzle locator 178 is effected by viewing the component through the opening of the nozzle locator where the opening corresponds to opening 136 shown in FIG. 8. Since the locator is clamped about one-quarter to one-half inch above the module or board 208, it is important that the movement of the nozzle be essentially vertical near the module to insure accurate alignment of the nozzle with respect to the module. Moreover, when nozzle locator 178 is positioned around a component to be installed, it is important, when the locator is removed from the component, that the initial movement thereof be vertical to thus avoid contacting the newly installed component. Thus, it can be seen there are a number of advantages associated with the mechanism employed in the present embodiment for moving unit 172 back and forth between module 209 and its non-working position shown in FIG. 11.

Component removal/installation device 172 also includes a mechanism generally indicated at 189 which corresponds to button 116 of the embodiment of FIGS. 1 through 10 and the mechanism associated therewith. Also mounted on support column 170 is a module support member 187 which may be employed when installing a component on board 208 in a manner to be described below.

Microscope unit 206 includes a column 286 mounted on a block 288 which in turn is mounted on base 250. Rotatably mounted on column 286 is an arm 288. Fixedly attached to the end of arm 288 is a shaft 290. Attached to the shaft 290 is a conventional microscope 292 which can be rotated into position over PC board 208. In particular, when the nozzle locator 176 is positioned over component 209 to effect positioning thereof, the microscope 292 may be employed to view the component terminals vis-a-vis the edge 136 of the nozzle locator opening to thus facilitate very precise alignment of component 209 with the locator nozzle 176. Furthermore, the microscope may be employed for detailed inspection of the work area both before and after component removal or installation.

Figure 12:
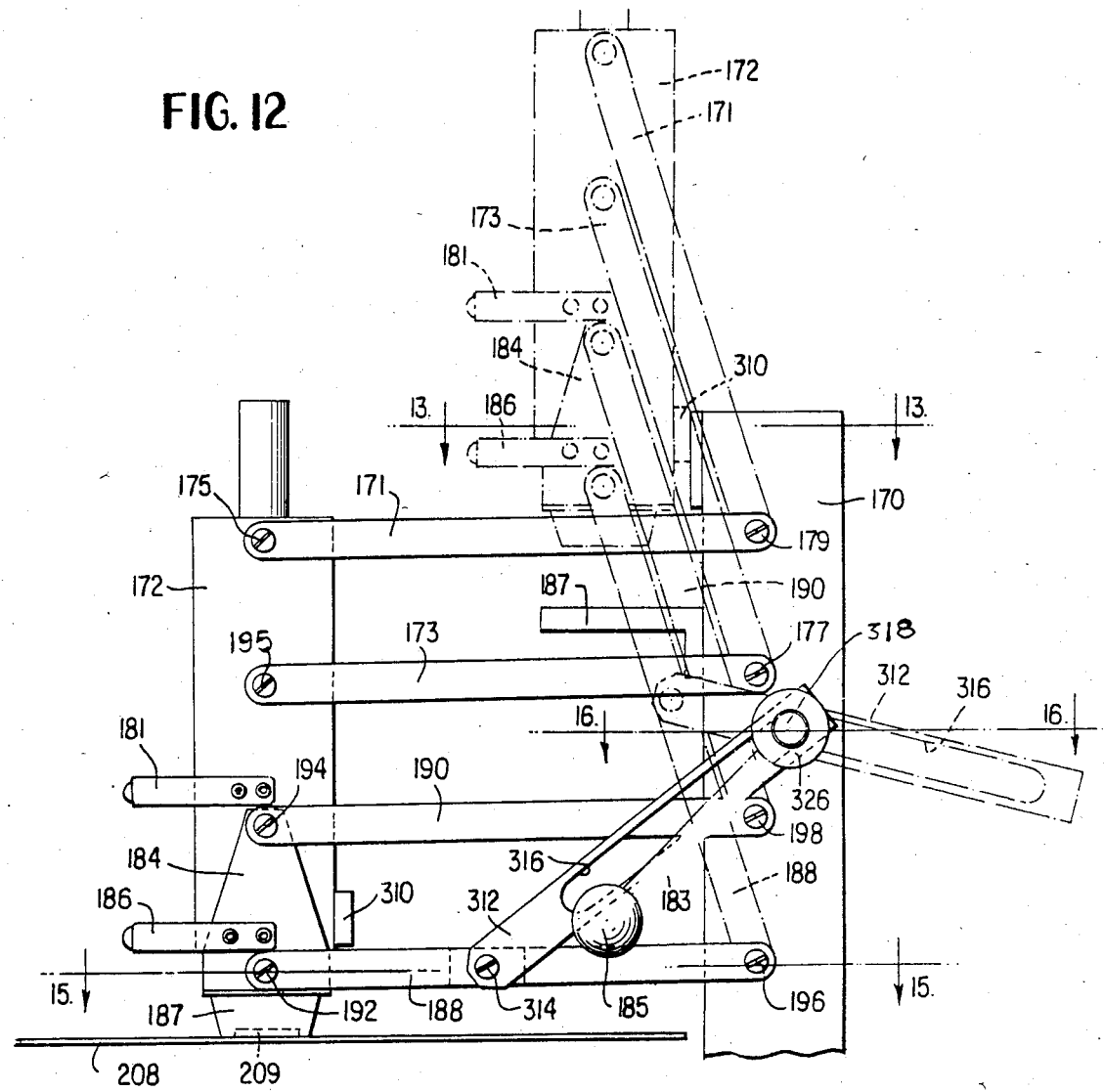
FIG. 12 is a side view of an illustrative component removal/installation device in accordance with the present invention illustrating different positions thereof.
Figure 13:
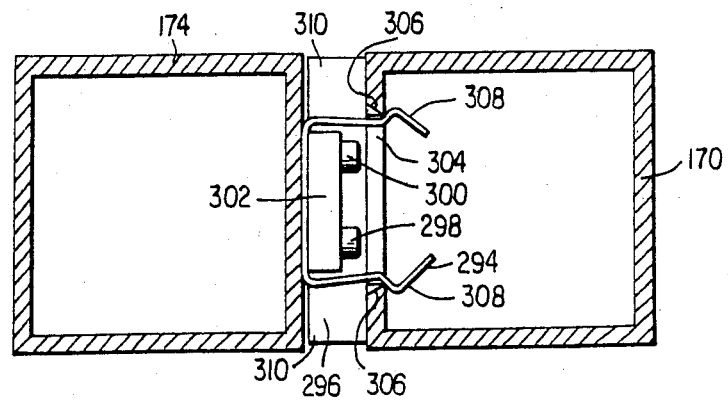
FIGS. 13, 15 and 16 are cross-sectional views respectively taken along the lines 13—13, 15—15, and 16—16 of FIG. 12.
Figure 14:
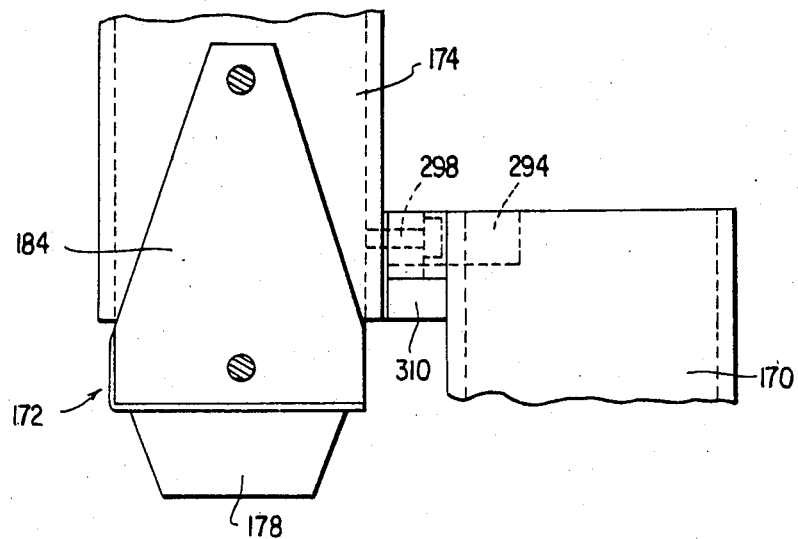
FIG. 14 is a detailed side view of FIG. 13.
Figure 16:
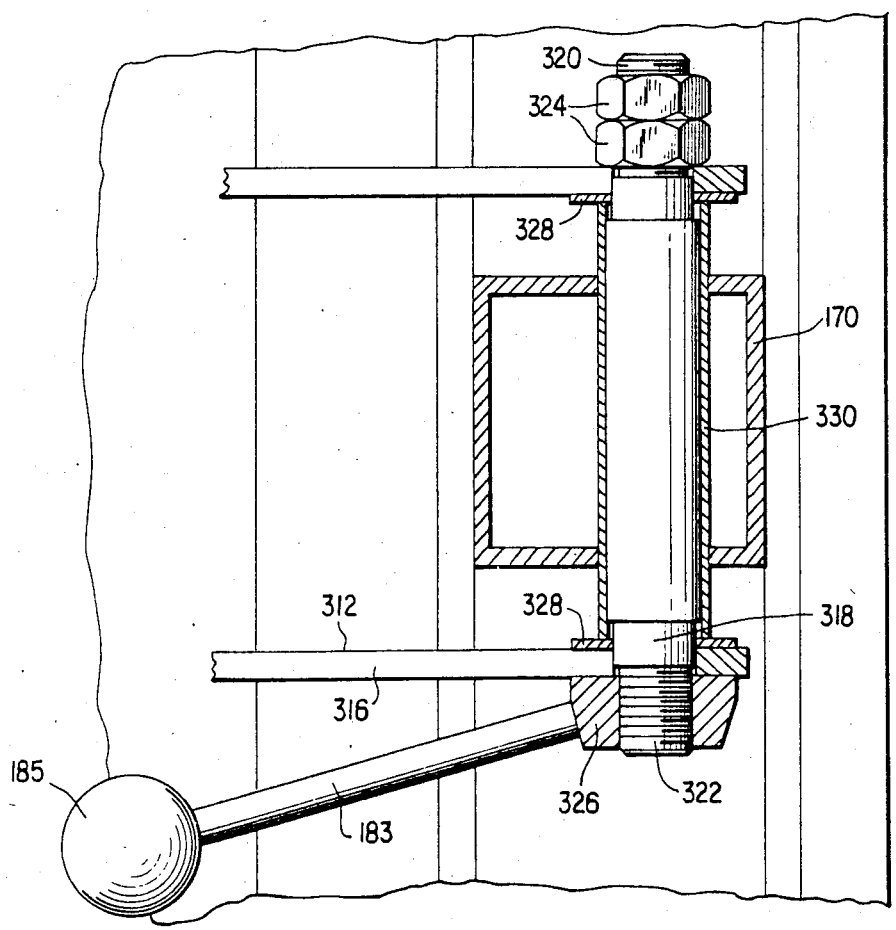

Reference should now be made to FIGS. 12 through 16 for a further description of the mechanism which raises and lowers component removal/installation unit 172 between its raised inoperative position and its lowered operative position. In FIG. 12 unit 172 is shown in phantom lines in its raised, inoperative position. In this position, the unit 172 is releasably attached to column 170 by a spring latch arrangement more clearly illustrated in FIGS. 13 and 14. A spring 294 is secured to the lower side wall of heater unit 174 via a block 296 which is secured to unit 174 via bolts 298 and 300. Block 296 includes an opening 302 through which spring 294 extends. Column 170 includes an opening 304 having tapered edges 306 while spring 294 includes hooked ends 308. When the unit 172 is raised toward its inoperative position, the spring 294 will engage opening 304 whereby the hooked ends 308 will be pressed toward one another as the spring passes through opening 304. Once the hooked ends 308 are through opening 304, they snap apart to latch device 172 in its raised position.

Block 296 includes portions 310, which act as stops to prevent further insertion of spring 294 through opening 304 and thus position unit 172 with respect to column 170. Note magnets in column 170 and/or unit 172 may also be employed to releasably latch unit 172 in its raised, inoperative position.

Figure 15:
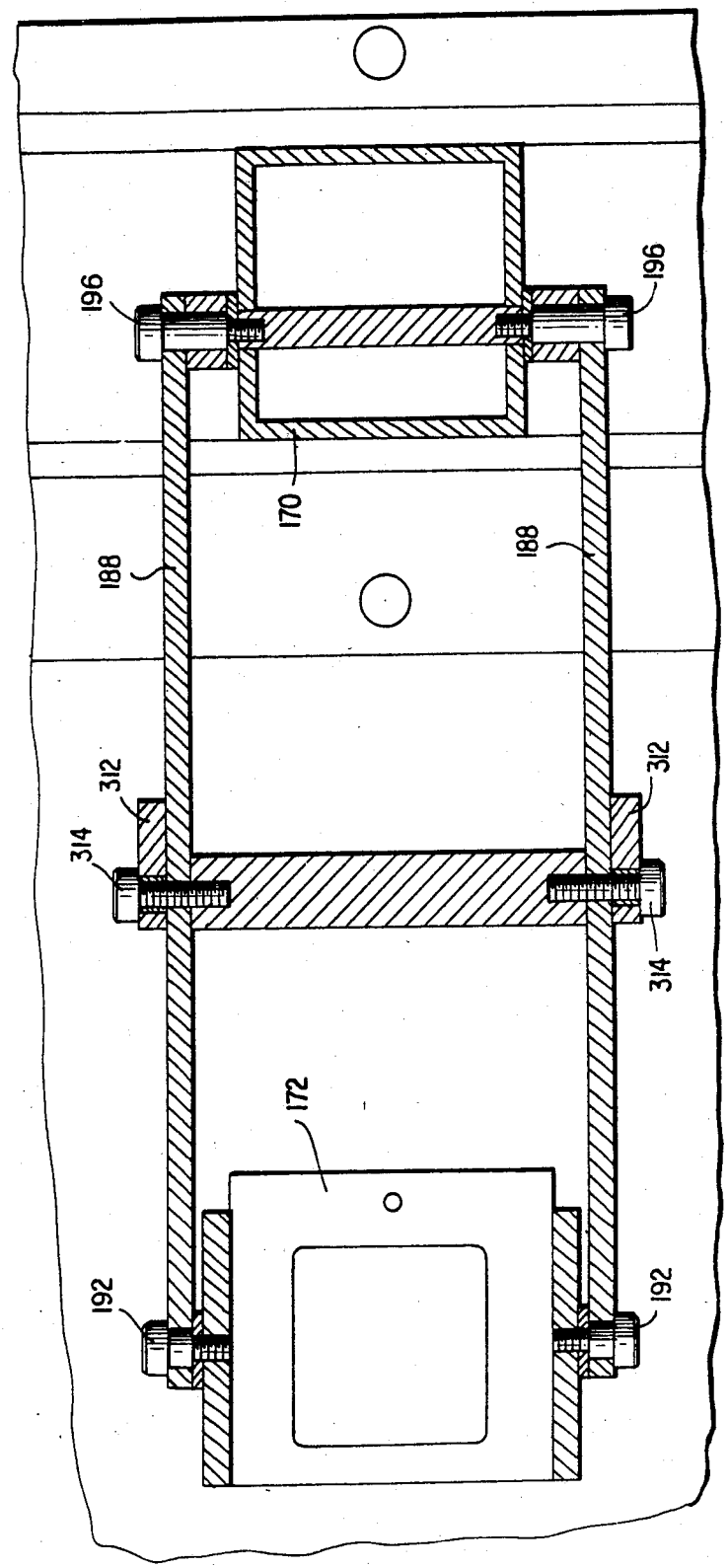
Figure 19:
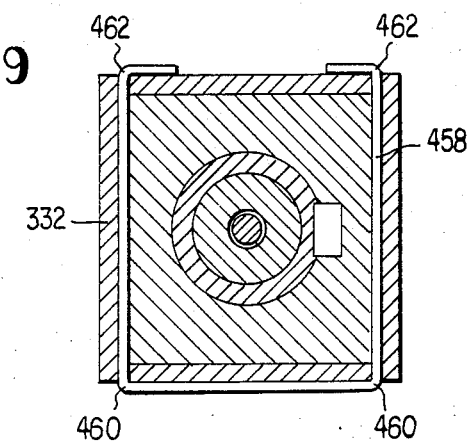
Figure 22:
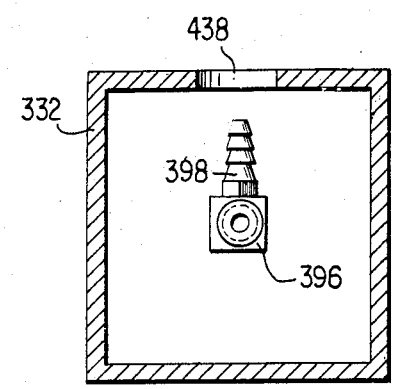

As discussed above, it is desirable to clamp nozzle locator unit 176 one-quarter to one-half inch above board 208 when effecting alignment of module 209 with respect to the locator. The means for effecting this clamping function includes, in addition to lever arm 183 and knob 185, an arm 312 (see FIGS. 12 and 16) which is pivotally connected to arm 188 by a pin 314 (FIG. 15). Arm 312 includes an elongated slot 316. A shaft 318 extends through slot 316, the shaft 318 being non-rotatably mounted in support column 170. Shaft 318 includes threaded ends 320 and 322. Threaded onto end 320 are a pair of nuts 324 which hold the shaft in place. Threaded onto end 322 is a nut 326. A sleeve 330 with end flanges 328 is non-rotatably disposed on shaft 318. Lever arm 183 with its attached knob 185 are connected to nut 326. When lever arm 183 is clockwise rotated, as viewed in FIG. 1, the component removal/installation unit 172 will be clamped into a desired position, which, as stated above, may be one-quarter to one-half inch above PCB 208. That is, rotation of arm 183 tightens nut 326 against arm 312 and flange 328 of sleeve 330 to thereby clamp arm 312 and thus arm 188 and its associated unit 172 into the desired position. As can be seen in FIG. 12, the shaft 318 is at or near one end of slot 316 when unit 172 is in its raised position and at or near the other end of the slot when unit 172 is in its lowered position. Since clamping can occur at any position intermediate the ends of slot 316, unit 172 can be clamped at any position intermediate its raised and lowered positions.

It should be noted the relationship between arms 171 and 173 is a perfect parallelogram regardless of the position in which unit 172 is clamped. The same applies to arms 188 and 190. This follows since the pivot pins 177, 179, 196 and 198 on column 170 and the pivot pins 175, 195, 192 and 194 on unit 172 are respectively vertically aligned with one another as can be seen in FIG. 12. Hence, unit 172 is maintained in vertical alignment with respect to board 208 regardless of the position in which it is held. As will be more evident hereinafter, when component support unit 187 is discussed, the maintenance of this vertical alignment is important not only at the lowered operative position of unit 172 but also in its raised position.

Figure 20:
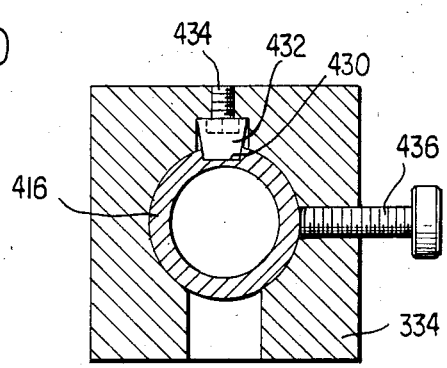
Figure 23:
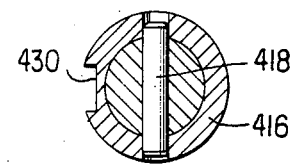
Figure 21:
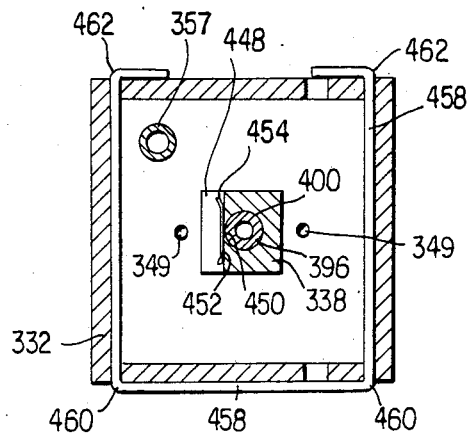

Reference should now be made to FIGS. 17 through 26 which illustrate component removal/installation unit 172 which comprises a casing 332 of generally square cross-section. The pins 177 and 179 which connect the casing to arms 171 and 173 are inserted in holes 464 and 466 in the casing side walls. The casing has a block 334 fixedly mounted in the upper end thereof and a nozzle block 336 fixedly mounted in the lower end thereof. A block 338 is also fixedly disposed in an intermediate portion thereof. A heater 340, which may be circular or square in cross section, is mounted between a cavity 341 in block 336 and a cavity 342 in block 338, seals 344 being provided in cavities 341 and 342 to provide an hermetic seal at the upper and lower ends of the heater. An opening 346 is provided in one side of the casing 332 to permit the passage of electrical wire 348 through holes 349 in block 338 to the heater (FIGS. 17 and 21). Another opening 350 is provided in the casing wall to permit an air hose 352 to be connected to a connector 354. The connector in turn, is connected to a chamber 356 formed between block 338 and an annular-like plate 357 disposed beneath member 338 within casing 332, the connection being effected by plate 357 which extends from connector 354 through block 338 to chamber 356 (FIGS. 17 and 21). A seal 358 is provided at the periphery of chamber 356 to provide an air-tight seal therefor.

A sleeve 360 surrounds heater 340 and is spaced therefrom to provide a passageway 362 which extends between chamber 356 and a chamber 364 formed between block 336 and annular like plate 366 formed within casing 332 and disposed above and spaced from block 336. A seal 368 provides an air-tight seal at the outer periphery of chamber 364. Extending through block 336 are a plurality of nozzles or apertures 370 which in plan view may conform to the apertures 122 shown in FIG. 6. Thus, these apertures conform to the general configuration of terminals 211 disposed at the periphery of semiconductor module 209. Furthermore, the size of the apertures 370 may vary in size. Typically, the terminals to which more heat is applied would be those connected to the ground plane or voltage supply layers of a multi-layer printed circuit board where the later layers act as heat sinks to rapidly draw heat away from any terminals connected thereto. In this manner more heat may be applied to the terminals which act as heat sinks to more efficiently effect melting of solder thereat. Of course, other variations in the size of the aperture openings are also within the scope of the present invention as are aperture configurations other than the square configuration of FIG. 6.

The passageway 362 is preferably filled with a material 363 such as steel wool whereby the wool will be heated by heater 340, the steel wool providing a large heated surface area for heating air passing through the passageway. Hence, heat transfer from heater 340 to the passing air is optimized. Any material similar to steel wool may be employed as long as it readily absorbs the heat from heater 340 and presents a large surface area for heating air passing through the passageway. The heated air under pressure enters chamber 364 where it is forced under high pressure through apertures 370 and exits as jets whereby the heated air easily passes along the inner sidewalls of nozzle locator 178 in a preferably turbulent-free manner to the terminals of component 209 in spite of the tendency of heated air to rise.

Figure 26:
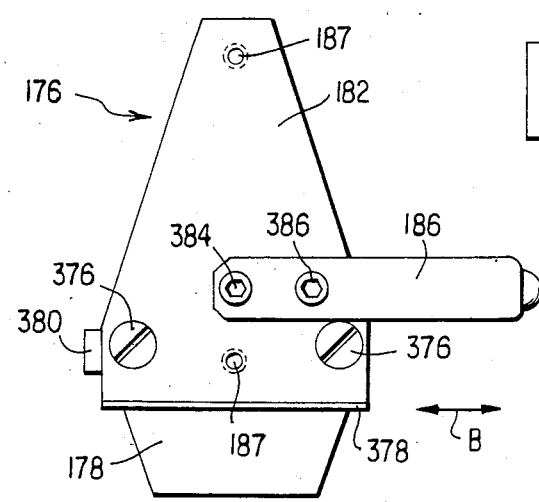
FIG. 26 is a side view of nozzle locator unit 176 of FIG. 11.

Nozzle locator unit 176 includes side walls 182 and 184 which are pinned at openings 187 to arms 188 and 190 as described above with respect to FIGS. 11 and 12. Fixedly disposed between the side walls 182 and 184 is support plate 180 having a rectangular opening 374, the size of the opening being slightly greater than the configuration of the apertures 370 in block 376. Plate 180 is held in place by screws 376 as can be seen in FIG. 26. Between walls 182 and 184 and plate 180 are a pair of springs 378, the springs being bent inwardly as shown in FIG. 17. Nozzle locator 178 is removably insertable between plate 180 and springs 378, the springs holding the locator in place after it is inserted. A stop 380 is mounted on the rear end of plate 180 whereby the portion 382 (FIG. 17) extending beneath plate 180 acts as a stop to limit the extent of insertion of nozzle locator 178 into locator unit 176. Thus, referring to FIG. 26, locator 178 is either inserted into or removed from unit 176 in the direction of arrow B whereby locators of different sizes may be inserted to accommodate different sized modules 209. As indicated in FIG. 17, the upper opening in locator 178 will conform in size to opening 374 in member 372 while the lower opening in the locator will vary depending upon the size of module 209.

Figure 24:
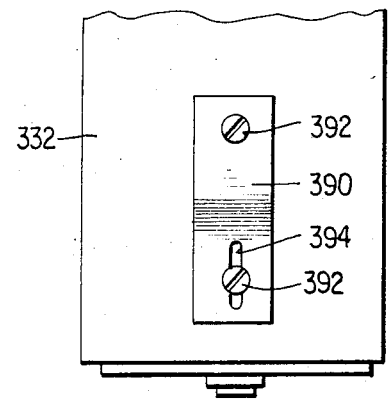
FIG. 24 is a detailed plan view of mounting spring 390 shown in FIG. 17.
Figure 25:
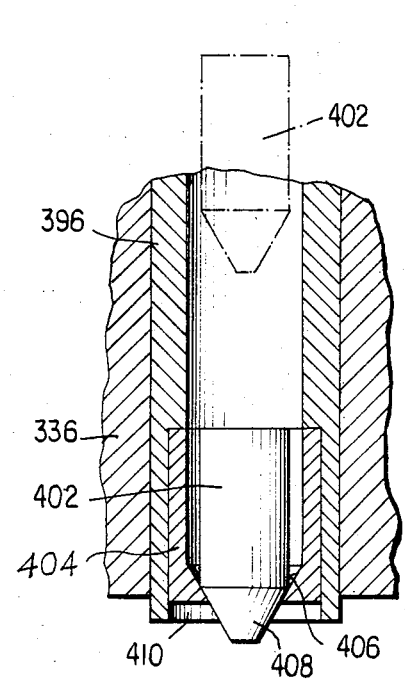
FIG. 25 is an enlarged view of plug 402 disposed in vacuum tube 396 of FIG. 17.

As shown in FIG. 26, handle 186 is secured to side wall 182 by screws 384 and 386. As discussed above, as handle 186 is pulled in the direction of the arrow A in FIG. 11 to separate nozzle locator unit 176 from heater unit 174. As can be seen in FIGS. 17 and 24, leaf springs 390 are secured to the opposite walls of casing 332 by screws 392 where a slot 394 may be provided in the springs so that they may slide in or out slightly and thus accommodate the frictional fit between units 174 and 176.

Referring to FIGS. 17 through 23 and 25, the mechanism for applying vacuum to semiconductor module 209 to thus effect installation or removal thereof will now be discussed. This mechanism includes a vacuum tube 396 having an air connection 398 adapted to receive an air hose (not shown) extending from control unit 202 or any other appropriate source. Tube 396 extends through a circular opening 400 in block 338 (FIG. 21) and similar openings in heater 340 and lower block 336.

A movable plug 402 (FIGS. 17 and 25) rests at the bottom of tube 396 and in particular in a tubular insert 404 fixedly disposed at the bottom of the tube. Insert 404 is tapered at the lowe end 406 thereof as is the lower end 408 of plug 402. Thus as long as no vacuum is applied to tube 396, plug 402 will rest in the position shown in FIG. 25. However, when a vacuum is applied to the tube, plug 402 will rise slightly within tube 396 to, for example, the dotted line position whereby vacuum will be applied through opening 410 at the bottom of the tube. As will be described in more detail hereinafter, application of vacuum through opening 410 will attract module 209 thereto to thus hold the module in place during installation thereof or to effect removal of the module if the module is being removed from board 208. Plug 402 is particularly adapted for use during installation of the module on the board. That is, vacuum may be applied through tube 396 while the module is being positioned on the board preparatory to attachment of the module to the board. Once the module is in place and has been secured to the board, it is necessary, of course, to remove the vacuum and raise tube 396 from the upper surface of the module. In accordance with the present invention when the vacuum is turned off, the plug 402 will drop from its dotted line position shown in FIG. 25 to the surface of the module to thus effect a separation of tube 396 from the module. A fluid tight seal is not formed at the bottom of the tube containing the plug and at all times there will be sufficient air entering the tube 396, at the bottom thereof, to maintain the plug in the suspended condition, as long as vacuum is applied. If plug 402 were not present, there would be a tendency for the module to lift with tube 396 even though the vacuum is turned off. This tendency is overcome by plug 402 in the manner described.

The mechanism 189 for raising and lowering vacuum tube 396 will now be described. This mechanism includes a plunger 412 having a slot 414 extending therethrough (FIG. 18). Plunger 412 is movable within a sleeve 416, which sleeve is slidably disposed in an opening in block 334. A rod 418 (FIGS. 17, 18 and 23) extends between opposite sides of sleeve 416 to limit the movement of plunger 412. A spring 420 normally biases plunger 412 to its raised position shown in FIGS. 17 and 18, the spring extending between a ridge 422 at the lower end of the plunger and a plug 424 fixedly disposed within the bottom of sleeve 416. A screw 426 is threaded through plug 424 and threaded into the upper portion of vacuum connector 398 to thus connect sleeve 416 to vacuum tube 396. Sleeve 416 is provided with a keyway 430 (FIGS. 18 20, and 23) into which is inserted U-shaped spring 432, the spring being secured to block 334 by a screw 434. Thus, rotation of sleeve 416 during movement thereof is prevented by the keying thereof. This arrangement is particularly advantageous in that spring 434 is used to effect the keying—that is, due to its resiliency, it can readily fill the keyway 430 to prevent rotation of the sleeve. This is effected in an economical manner while at the same time avoiding the need to meet close tolerances between the spring and keyway. As will be discussed below, it is necessary sleeve 416 not rotate since this member is instrumental in insuring that, during the installation of a component, the component is accurately positioned with respect to the printed circuit board. Moreover, since sleeve 416 cannot rotate, neither can plunger 412 since shaft 418 extending through the plunger prevents rotation of the plunger with respect to the sleeve. Once sleeve 416 has been appropriately positioned to facilitate installation of a component, it may be locked in this position by locking screw 436, which is threaded through the side of block 334 to engage the side of sleeve 416 to hold it in the desired position (FIGS. 17 and 20).

Since plunger 412 is resiliently connected to sleeve 416 via spring 420 and since the sleeve is connected to air connector 398 via screw 428, movement of plunger 412 is transferred to vacuum tube 396. A slot 438 (FIGS. 17, 18 and 22) is provided to facilitate the raising and lowering of air connection 398 with its attached hose 399 the extent of the slot being sufficient to accommodate the extremes of movement of connection 398. A spring 440 is provided between a ridge 442 on connector 398 and a raised portion 444 on block 338, this spring being weaker than spring 420.

Movement of vacuum tube 396 is effected by the operator pressing downwardly on plunger 412 to compress spring 440, this spring compressing first since it is weaker than spring 420. Thus, initially, the lower end of tube 396 is lowered to the lower end of nozzle locator 178. At about this time, the upper edge 446 of slot 414 (FIG. 17) engaged shaft 418 thereby depressing sleeve 416 along with plunger 412—that is, there is no longer relative movement between the plunger and sleeve. Now pressure is exerted against stronger spring 420, which is a safeguard against excessive downward force, and thus the operator can effect more precise control over the tube as it comes into contact with the module. Hence, during the initial movement of tube 396, the operator's pressure is exerted against relatively weak spring 440 to facilitate rapid lowering of the tube to the open lower end of locator 178. Next, the operator's pressure is exerted against the stronger spring 420 to provide precise control when contacting the module with tube 396. As stated above, when desired, sleeve 416 may be locked into an appropriate position by locking screw 436.

A mechanism is also provided in accordance with the present invention whereby the need to meet close tolerances between vacuum tube 396 and opening 400 in block 338 and the openings in heater 340 and block 336 may be avoided. Thus, referring to FIGS. 17 and 21, a notch 448 is provided in raised member 444 on block 338. Notch 448 provides a slight opening 450 in hole 400. Attached to the bottom of the notch 448 at 452 is a curved spring 454 which extends into opening 450 to bias vacuum tube 396 to one side of opening 400. Thus, tube 396 may freely slide through opening 400 and yet undue lateral movement of the tube within the opening is avoided because of spring 454, this being accomplished without resorting to close tolerances between the opening and the tube. A similar arrangement is preferably provided at projecting portion 456 of lower block 336.

Blocks 334, 336 and 338 are fixedly disposed with respect to casing 332 by clamps 458 which have a generally U-shaped configuration (FIGS. 19 and 21), the clamps extending through openings 460 and 462 in the opposite side walls of casing 332. Preferably blocks 334, 336 and 338 are made of a slightly resilient material such as the material known as ceramic paper. Thus, the clamps will slightly depress the blocks as indicated at 461 in FIG. 17. Other means may, of course, be employed to fix these blocks with respect to the casing.

Figure 27:
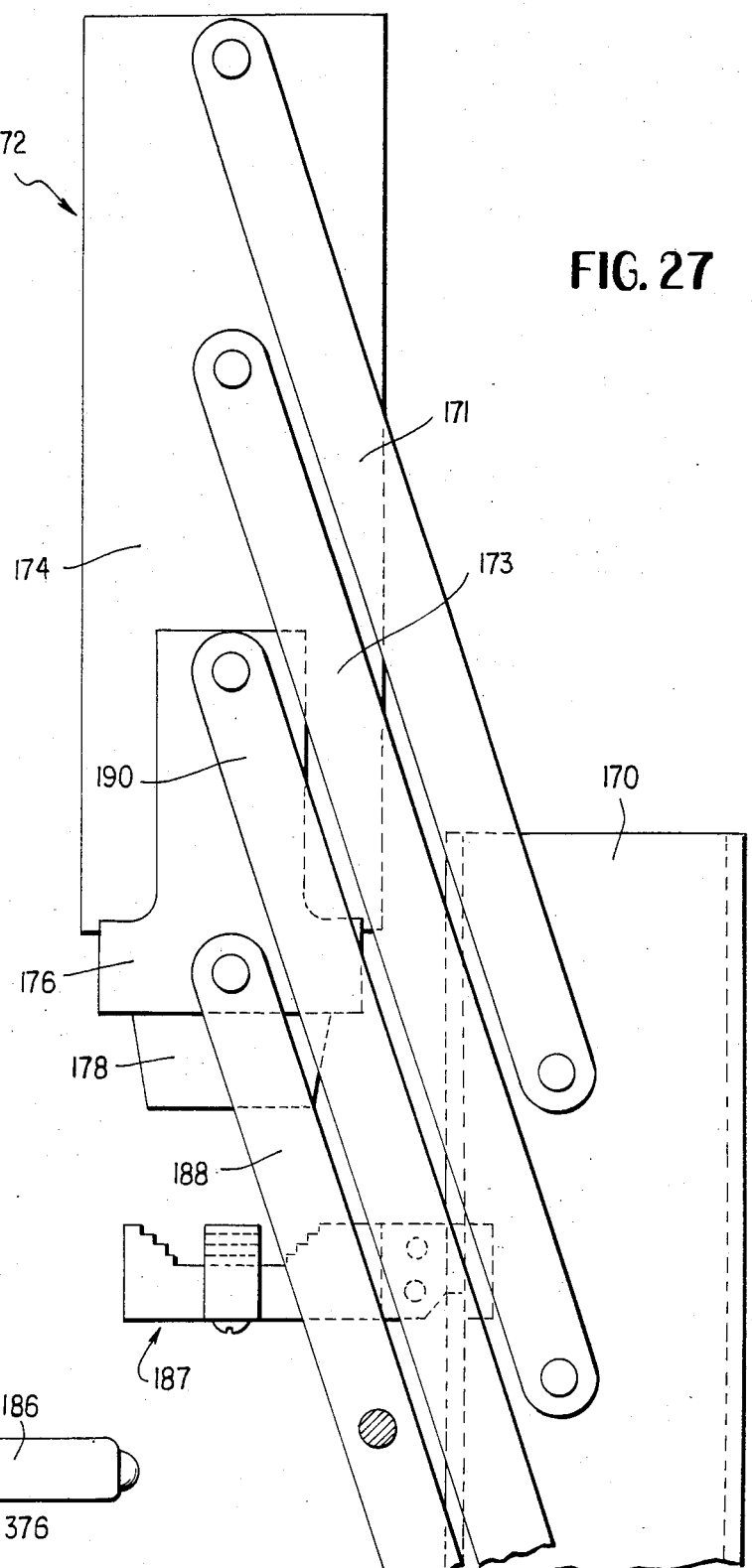
FIG. 27 is a side view illustrating the relationship between solder removal/installation unit 172 and a unit for supporting semiconductor modules with respect to unit 172 when the latter unit is in its raised, inoperative position.
Figure 28:
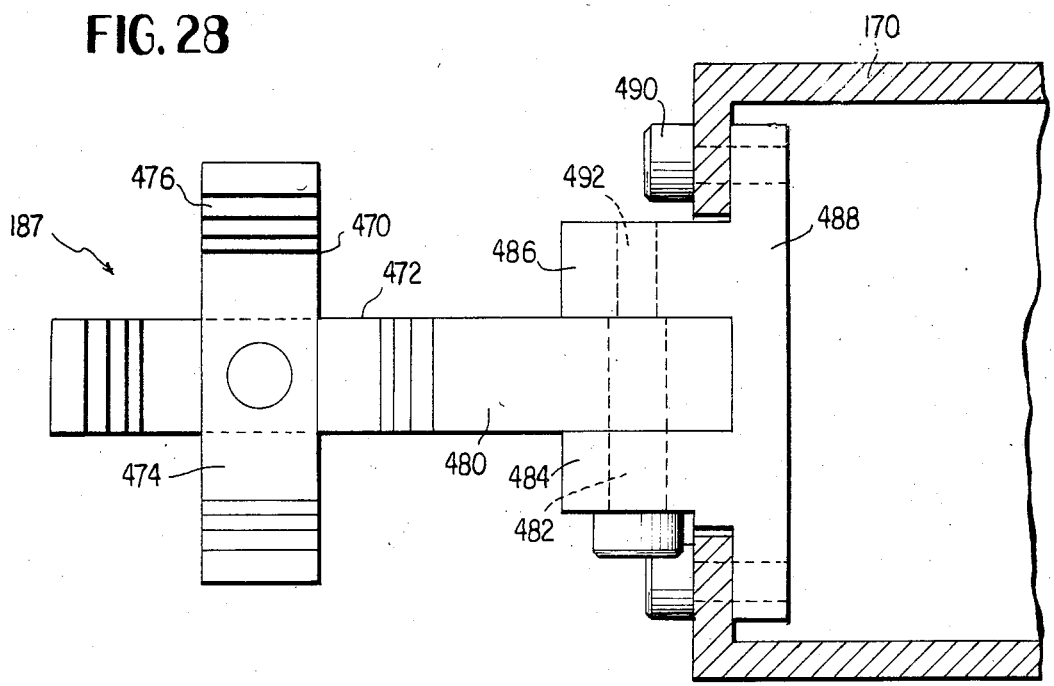
FIGS. 28 and 29 are plan and side views of the module support unit of FIG. 27 where in FIG. 29 different positions of the support unit are illustrated.
Figure 29:
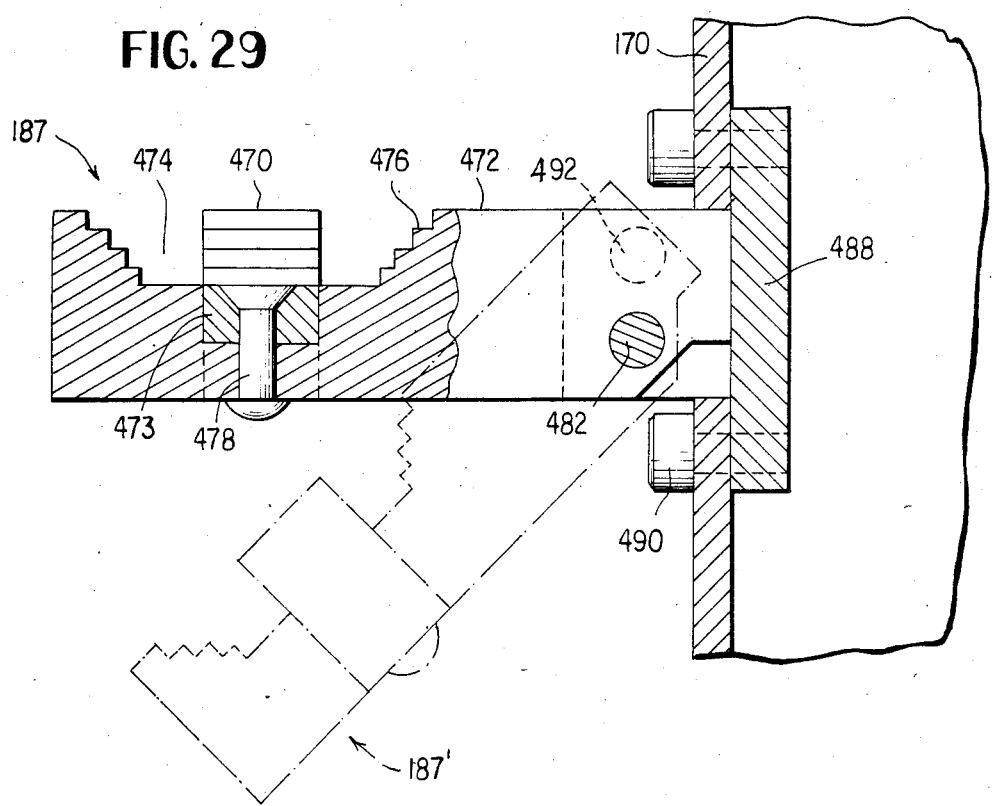

Reference should now be made to FIGS. 27 through 29 which illustrate in more detail the module support unit 187. The purpose of this unit is to provide a location where a new module to be installed on board 208 may be located while preliminary positioning of the board with respect to nozzle locator 178 is taking place. Furthermore, once locator 178 has been accurately positioned with respect to the board, it will be reattached to heater unit 174 as discussed above and as shown in FIG. 27. The module disposed in locator unit 187 may then be removed therefrom by vacuum tube 396 where the resultant positioning of the module with respect to component removal/installation unit 172 will be accurately effected due to the exact positioning of module support unit 187 with respect to unit 172 when the latter unit is in its raised, inoperative position, this exact positional relationship being illustrated in FIG. 27.

In more detail module support unit 187 includes first and second stepped members 470 and 472 where member 470 is disposed in a groove 473 (FIG. 29) provided in member 472. Each of the members 470 and 472 includes a cavity 474 where the sides of the cavities are stepped as indicated at 476 to thereby accommodate semiconductor modules of different sizes. The member 472 and 474 are bolted together by a bolt 478 (FIG. 29) to thereby support the module at the four sides thereof. Stepped member 472 includes an elongated portion 480 which is pivotally mounted on a shaft 482 which is fixedly disposed in projecting members 484 and 486 of a block 488 secured in support column 170 by bolts 490. Disposed above shaft 482 in projecting member 486 is a spring loaded detent 492 which engages an indentation (not shown) in the side of elongated portion 480 to hold locator 187 in its raised, solid line position shown in FIG. 29. Simple downward pressure by the operator will release the detent to permit rotation of support unit 187 away from unit 172 to the FIG. 29 phantom line position. In this position, a module may be easily inserted into unit 187. It may then be rotated back to its solid line position in alignment with unit 187 where it will again be held by detent 492.

Figure 30:
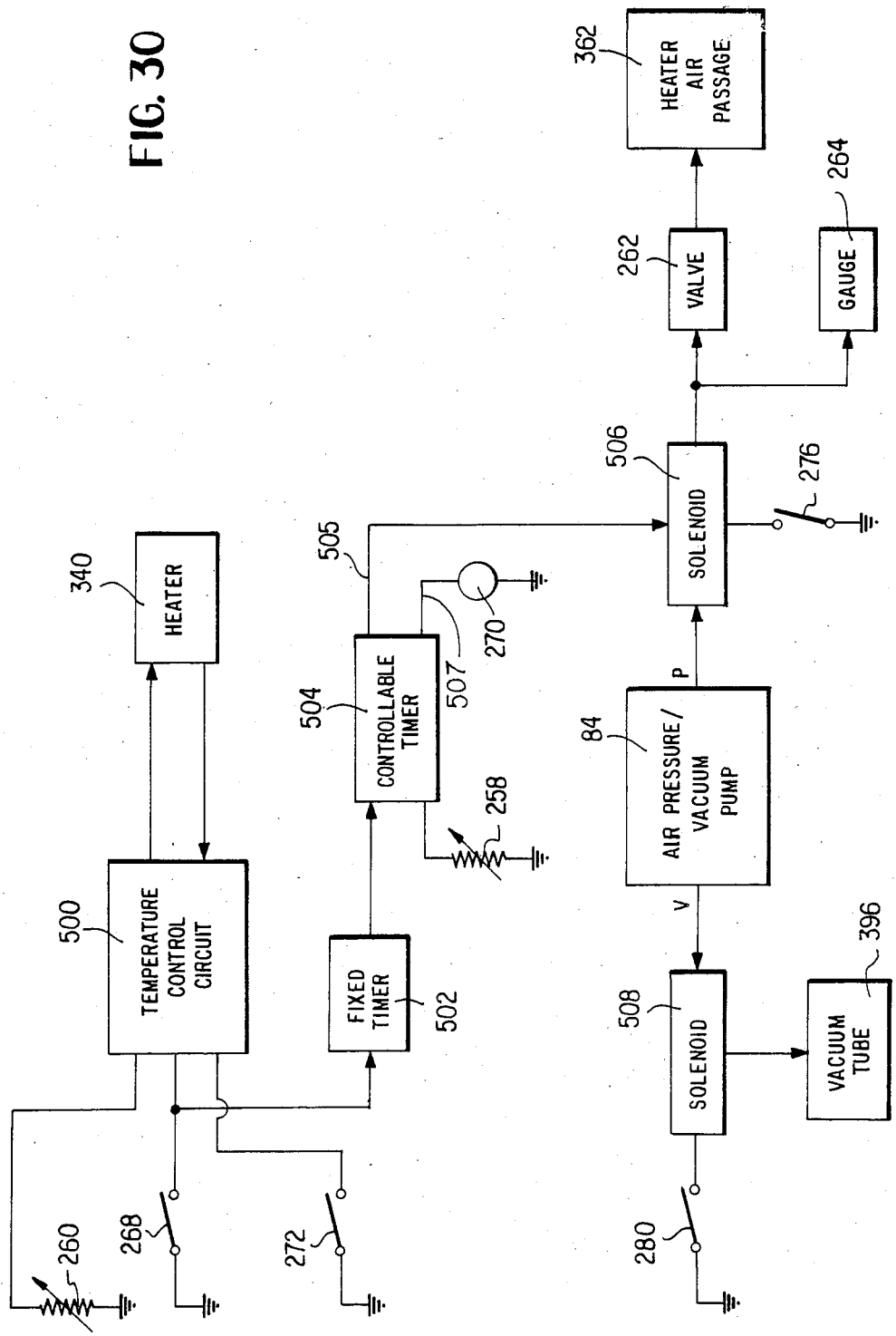
FIG. 30 is a block diagram of illustrative circuitry for use in the control unit 202 of the present invention.

Referring to FIG. 30 there is shown a block diagram of the control circuitry for control unit 202, the circuitry including a temperature control circuit 500 for heater 340 and the circuit being actuated upon closure of switch 268 and rendered inoperative upon closure of switch 272. The temperature to which heater 340 is set is controlled by rheostat 260.

As discussed above, closure of switch 268 also initiates a fixed timer 502, its timing period typically being 45 seconds. Once this time has elapsed, an output from timer 502 is applied to a controllable timer 504, it being controlled by rheostat 258. The timer is typically set to 10 to 15 seconds. An output signal is applied from timer 504 for the duration of its timing period over line 505 to a solenoid 506 which applies air under pressure through adjustable valve 262 to heater air passage 362 as described above. The amount of pressure may be controlled by valve 262 and measured by gauge 264. As soon as the timing period of timer 504 elapses an output signal is applied over line 507 to flash light 270. Air pressure to passage 362 may be terminated upon closure of switch 276. Vacuum from pump 84 is applied through solenoid 508 to vacuum tube 396 where switch 280 is of the type where upon first actuation thereof the solenoid passes the vacuum and upon the next actuation thereof, the vacuum is cut off.

Other controls on the panel of control unit 202 have been mentioned above, but have not been described with respect to the circuit of FIG. 30 due to the well known nature thereof.

Although there has been mentioned, in the foregoing description of the invention, hoses connected between control unit 202 and component removal/installation device 172, these hoses have not been illustrated to simplify the illustration and discussion of the remaining parts of the invention.

OPERATION

The present invention may be employed in two modes of operation—that is, either the removal or installation of a component. The removal of a component will first be described. Referring to FIG. 11, it is assumed component 209 is to be removed. First, it is generally positioned in the middle of workpiece manipulating unit 200. This is effected by first appropriately positioning the board 208 between clamps 204 and then tightening the clamps via tightening screws 230 to thus effect rough positioning of component 209 in the X direction indicated in FIG. 11. The board is then moved along rails 234 to thereby roughly position the component in the Y direction where the X and Y directions are orthogonal. Locking screws 232 are then tightened to secure this first rough position.

In order to provide more precise positioning of the component 209, the operator next pulls handle 186 in the direction of the arrow A in FIG. 11 to separate nozzle locator unit 176 from heater unit 174 whereby the nozzle locator 178 is moved into a position generally over module 209. Preferably the locator is positioned one-quarter to one-half inch above module 209 and clamped in this position by moving locking lever 183 in the clockwise direction. The component 209 may now be viewed through the flared opening in locator 178, this view corresponding to that illustrated in FIG. 8. Although a member using cross hairs 142 is employed in FIG. 9 to effect precise alignment of the module with respect to the nozzle locator, such a member need not be employed in the embodiment of FIGS. 11 through 30. Rather, the nozzle locator, as previously described, has already been chosen so that the lower opening thereof is only slightly greater than the periphery of the component 209. Thus, it has been found that final precise adjustment of the position of components 209 with respect to nozzle locator 178 can be effected by first turning fine adjustment screw 238 (FIG. 11) whereby component 209 will be slightly shifted in the Y direction until precise alignment is effected in this direction. Next, fine adjustment screw 252 is turned to effect precise alignment in the X direction to thereby complete the fine adjustment of component 209 with respect to the nozzle locator. After clamp 183 is removed, the nozzle locator is then re-attached to heater unit 174 by pivoting it via handle 186 back to the position shown in FIG. 11. Unit 172 including both units 174 and 176 is then returned to module 209 by pulling handle 181 whereby unit 172 will now be accurately positioned with respect to the module and preferably in direct contact with board 278 or the terminals of the component.

The operator next pushes button 268 of control unit 202 which initiates the supply of electrical current to heater 340. Once 45 seconds, for example, has elapsed a valve is opened which initiates the flow of air through passage 362 of the heater. Since, as discussed above, this passage is filled with a material such as steel wool, heat from the heater is very efficiently transferred to the air flowing through the passage. This air will flow through the nozzles 370 and thence to the terminals of component 209. Depending on the time set at knob 258, the heated air will be applied to the solder at the terminals, this time typically being about 10 to 15 seconds, to thus eventually melt the solder.

When the time set at knob 258 has elapsed, light 270 will flash indicating the operator should remove component 209 from the board. Thus, the operator pushes button 270 to start the vacuum flow. The operator then depresses plunger 412 to lower vacuum tube 396 onto the component as described above. The plunger is then released and returned to its rest position by spring 440. Solder removal/installation unit 172 may then be raised to its inoperative position by handle 181. Buttons 272, 276 and 280 may now be actuated to cut off the heater and air flow thereto and to disable the vacuum. Of course, as soon as the vacuum is cut off, the removed component 209 will be released.

Once component 209 is removed, microscope unit 206 may be positioned in place over the area from which component 209 was removed to effect a microscopic inspection of the area to determine if further maintenance is necessary. Further, as discussed hereinbefore, microscope 206 may also be employed during the fine alignment of component 209 with respect to nozzle locator 176.

If a new component is to be immediately installed in the place of removed component 209, this component may be manually positioned on board 208 prior to the lowering of unit 172 into position over the component. However, it is preferable the new component be positioned in support 187 on the particular steps accommodating that component. As discussed above, with unit 172 in its raised inoperative position, support unit 187 may be pivoted away from unit 172 to facilitate the insertion of new component 209 into support 187. As also discussed above, it is preferable to position component 209 utilizing support 187 since this insures accurate positioning of the component with respect to component removal/installation unit 172.

Whether new component 209 is manually positioned or positioned with the aid of support 187, unit 172 will be ready for immediate use since it has already been accurately located with respect to the area vacated by the old component 209 prior to the removal of the old component. Of course, if this prior fine positioning of the component with respect to nozzle locator 178 has not been done, it must be done in the manner described above with respect to the removal of the old component.

The next step performed by the operator is to push button 280 to initiate vacuum flow through tube 396. Next, the operator depresses plunger 412 until the bottom of tube 396 engages the upper surface of the component disposed in support unit 187. The plunger is then slightly released to raise the component into the space enclosed by nozzle locator 178. Locking screw 426 is then tightened to hold the component in this position. Handle 181 is then actuated to pivot unit 172 into place over board 208. In the present description, it is assumd component 209 is of the LCC type such that the terminals thereof do not extend beyond the periphery of the lower opening at the bottom of nozzle locator 178 whereby the component can be withdrawn with the inner space of locator 178. As will be described below, the procedure is somewhat different for flat-pac carriers.

Unit 172 is now moved via handle 181 to the area on board 208 where the new component is to be installed with the lower edges of nozzle locator 178 resting on board 208. Locking screw 436 is then released and the operator depresses plunger 412 until component 209 comes into firm contact with board 208. Locking screw 436 is again tightened to keep the component in place while continued application of the vacuum takes place. Next button 268 is depressed to bring the heater up to the desired temperature after which air flow through the heater automatically commences as described above to effect melting of the solder whereby component 209 will be connected in place on the board upon cooling of the solder. Once light 270 starts to flash, this indicates to the operator the solder has melted and that component removal/installation 172 may be raised to its inoperative position. First the operator actuates buttons 272, 276 and 280 to cut off the heater and the air flow therethrough and the vacuum applied thrugh tube 396. As described before with respect to FIG. 25, plug 402 will drop onto new component 209 at this time to effect a slight separation of the component with respect to the tube. Locking screw 436 may now be loosened to permit the removal of plunger 412 to its normal, raised position without concern that the tube may stick to the component as it is being raised.

Having now described the operation with respect to an LCC module, the operation with respect to a flat-pac carrier module differs only in that nozzle locator 178 is so selected that when the module is disposed in the opening at the lower end of the module, the module body will be within the opening whole the terminal 211 will extend beyond the lower opening periphery. Thus, when the module is raised from its support unit 187 preparatory to the installation thereof on the board, the module is not withdrawn into the inner space of locator 178. Rather, it is raised to the lower opening of the locator where the flexible terminals thereof come into contact with the periphery of the lower opening. It is then held in place there by tightening screw 436 as it is transported to board 408. Once the module is on the board, the periphery of the lower end of nozzle locator 178 may be pressed against the flexible terminals to straighten them out on the board and thus facilitate attachment of the module to the board.

Applicant has thus disclosed his novel device for rapidly and accurately removing electronic components from or installing them on a substrate. However, it is not intended to limit the invention to the embodiment of the device which has just been described and it is intended by the appended claims to include all technically equivalent means which come within the full scope and true spirit of the invention.

What is claimed is:

1. A device for attaching modular electronic component to or removing them from a substrate where each component has a plurality of terminals disposed at the periphery thereof, said device comprising:
   component removal/installation means including heater means having at least one passage extending therethrough for heating a fluid flowing through said passage;
   means for passing the heated fluid from said passage to the terminals of the component to effect melting of solder or the like thereat; and
   moving means for moving said component removal/installation means between a first, operative position over the component so that the solder may be melted and a second, inoperative position removed from the component, the first and second positions being substantially disposed in a vertical plane substantially perpendicularly oriented with respect to the substrate, said moving means rendering the movement of the component removal/installation means substantially vertical with respect to the substrate as it either approaches or is removed from said first position and rendering the movement of the component removal/installation means substantially horizontal with respect to the substrate as it approaches or is removed from its second inoperative position, wherein said means for moving the component removal/installation means includes means for moving it through about ninety degrees of a circle and the movement being substantially in said vertical plane.

2. A device as in claim 1 wherein said moving means includes means for maintaining said component removal/installation means vertically aligned with respect to said substrate at least at its first and second positions.

3. A device as in claim 2 where said vertical alignment is maintained at all positions between the first and second positions.

4. A device as in claim 3 including a component removal/installation means support unit; first and second arms where each arm is pivotally mounted at one end thereof to said heater means and the other end of each arm is pivotally mounted with respect to said support unit and where the points where the first and second arms are pivotally mounted with respect to the heater means are substantially vertically aligned and the points where the arms are pivotally mounted with respect to the support unit are also substantially vertically aligned to thereby effect said vertical alignment of the component removal/installation means at all positions between and including said first and second positions thereof.

5. A device as in claim 1 where said component removal/installation means includes a plurality of nozzles for directing the heated fluid from the passage to the terminals of the component and a nozzle locator means for facilitating location of the nozzles with respect to a predetermined location on the substrate corresponding to the location of the component terminals, and means for releasably attaching the nozzle locator means with respect to the heater means of the component removal/installation means.

6. A device as in claim 5 including means for separating said nozzle locator means from said heater means to position the nozzle locator means at said first, operative position, said nozzle locator means having an opening extending therethrough where the lower end of said opening is slightly larger in size than said component; and means for adjusting the position of the predetermined location on the substrate with respect to the nozzle locator means, said predetermined location being viewable through the opening in the nozzle locator means to determine when the predetermined location has been accurately aligned with respect to the nozzle locator means and thus the nozzles of the heater means.

7. A device as in claim 6 including means for clamping said nozzle locator means at any position between and including said first and second positions.

8. A device as in claim 6 including moving means for moving said nozzle locator means from the second position where it is attached to the heater means to the first position where it is employed to facilitate alignment of the predetermined location on the substrate, said nozzle locator moving means including means for effecting substantially vertical movement of the nozzle locator means with respect to the substrate as it approaches or is removed from the substrate surface and substantially horizontal movement with respect to the substrate as it approaches or is removed from the second position.

9. A device as in claim 8 where said nozzle locator moving means includes means for moving the nozzle locator means in said vertical plane through about ninety degrees of a circle.

10. A device as in claim 9 where said nozzle locator movement includes first and second arms where one end of each said arm is pivotally attached to the nozzle locator means and where the other end of each arm is pivotally attached to a component removal/installation means support unit, the pivot points on the nozzle locator means being vertically aligned with each other and the pivot points on the support unit also being vertically aligned with each other to thus maintain the nozzle locator means substantially vertically aligned with the substrate surface at said first and second end positions and all positions therebetween.

11. A device as in claim 10 including third and fourth arms where each of said latter arms is pivotally mounted at one end thereof to said heater means and the other end of each arm is pivotally mounted with respect to said support unit and where the points where the third and fourth arms are pivotally mounted with respect to the heater means are substantially vertically aligned and the points where the third and fourth arms are pivotally mounted with respect to the support unit are also substantially vertically aligned and where the pivot points for the nozzle locator unit are vertically aligned with the pivot points for the heater means and the pivot points for said first and second arms are vertically aligned with those for said third and fourth arms on the support unit whereby said heater means and said nozzle locator means will remain substantially vertically oriented with respect to said substrate and vertically aligned with each other at said first and second positions and all positions therebetween.

12. A device as in claim 1 including means for releasably clamping said heater means to a support unit when the heater means is in the first inoperative position.

13. A device as in claim 1 where porous, heat absorbant material having a large surface area is disposed in said passage to facilitate heat transfer from the heater means to the fluid flowing through the passage.

14. A device as in claim 13 where said material is steel wool.

15. A device as in claim 1 where said heater means includes a vacuum tube slidably mounted for vertical reciprocal movement therein, said vacuum tube being adapted for connection to a vacuum source, and being adapted for contact with said component to thereby facilitate the removal or installation of the component.

16. A device as in claim 15 where said vacuum tube includes a movable plug disposed in the lower end thereof, said plug resting at said lower end in the absence of vacuum being applied to the tube and rising a slight distance within the tube upon application of vacuum thereto so that, upon removal of the vacuum, the plug drops back to the lower end such that it will gently tap a modular electronic component attached to the vacuum tube to thus facilitate the removal of the tube from the component upon removal of the vacuum.

17. A device as in claim 15 where said heater means includes at least one bearing member having a hole extending therethrough through which said vacuum tube slides, said hole having an opening extending through the side thereof and biasing means extending through said opening to bias the vacuum tube to one side of the hole extending through the bearing member to thereby lessen undesirable movement of the vacuum tube within the hole without close tolerances between the vacuum tube and the hole.

18. A device as in claim 15 where said heater means includes a slidably mounted plunger for reciprocal vertical movement within the heater means, connection means for connecting said plunger to said vacuum tube to transmit the vertical movement of the plunger to the vacuum tube, said connection means including a sleeve through which said plunger slides, means for preventing relative rotational movement between the plunger and the sleeve, said sleeve also being slidably mounted for reciprocal movement within said heater, means for preventing relative rotational movement of the sleeve with respect to the heater means including a keyway in said sleeve and a flexible, substantially U-shaped spring mounted with respect to said heater means and extending into said keyway to effect said prevention of relative movement between the sleeve and heater means without close tolerances between the spring and the keyway since the spring, due to its resiliency, fills the keyway.

19. A device as in claim 1 including a component support unit for receiving modular electronic components of different sizes, the component support unit having a central axis substantially aligned with the component removal/installation means when the latter means is in its inoperative position whereby components disposed in said component support unit will be accurately aligned with the component removal/installation means.

20. A device as in claim 1 where said modular electronic component is a leadless chip carrier.

21. A device as in claim 1 where said electronic modular component is a flat-pac carrier.

22. A device as in claim 1 where said fluid is air.

23. A device as in claim 1 including means for initiating the application of electric current to said heater means to bring the temperature thereof to a desired temperature, means for applying fluid under pressure to said passage after a predetermined period of time has elapsed from the initiation of the heater current, and means for applying the heated fluid through the passageway for an adjustable period of time to thus effect melting of solder.

24. A device as in claim 23 including means for providing a signal to the operator after the heated fluid has flowed through the passageway for said adjustable period of time to thereby indicate the solder has melted.

25. A device as in claim 23 including means for applying a vacuum to said component after the solder has been melted to effect removal of the component from the substrate.

26. A device as in claim 23 including vacuum means for holding said component in place on said substrate as said solder is being melted, and means for removing the vacuum after the solder has been melted to effect removal of the component removal/installation means from the component to thereby effect installation of the component on the substrate.

27. A device for attaching modular electronic components to or removing them from a substrate where each component has a plurality of terminals disposed at the periphery thereof, said device comprising:
heater means having at least one passage extending therethrough for heating a fluid flowing through said passage;
means for passing the heated fluid from said passage to the terminals of the component to effect melting of solder or the like thereat;
said heater means including a vacuum tube slidably mounted for vertical reciprocal movement therein, said vacuum tube being adapted for connection to a vacuum source, and being adapted for contact with said component to thereby facilitate the removal or installation of the component where said vacuum tube includes a movable plug disposed in the lower end thereof, said plug resting at said lower end in the absence of vacuum being applied to the tube and rising a slight distance within the tube upon application of vacuum thereto so that, upon removal of the vacuum, the plug drops back to the lower end such that it will gently tap a modular electronic component attached to the vacuum tube to thus facilitate the removal of the tube from the component upon removal of the vacuum.

28. A device for attaching modular electronic components to or removing them from a substrate where each component has a plurality of terminals disposed at the periphery thereof, said device comprising:
component removal/installation means including heater means having at least one passage extending therethrough for heating a fluid flowing through said passage;
means for passing the heated fluid from said passage to the terminals of the component to effect melting of solder or the like thereat;
said heater means including a vacuum tube slidably mounted for vertical reciprocal movement therein, said vacuum tube being adapted for connection to a vacuum source, and being adapted for contact with said component to thereby facilitate the removal or installation of the component where said heater means includes at least one bearing member having a hole extending therethrough through which said vacuum tube slides, said hole having an opening extending through the side thereof and biasing means extending through said opening to bias the vacuum tube to one of the hole extending through the bearing member to thereby lessen undesirable movement of the vacuum tube within the hole without close tolerances between the vacuum tube and the hole.

29. A device for attaching modular electronic components to or removing them from a substrate where each component has a plurality of terminals disposed at the periphery thereof, said device comprising:
component removal/installation means including heater means having at least one passage extending therethrough for heating a fluid flowing through said passage;
means for passing the heated fluid from said passage to the terminals of the component to effect melting of solder or the like thereat;
said heater means includes a vacuum tube slidably mounted for vertical reciprocal movement therein, said vacuum tube being adapted for connection to a vacuum source, and being adapted for contact with said component to thereby facilitate the removal or installation of the component where said heater means includes a slidably mounted plunger for reciprocal vertical movement within the heater means, connection means for connecting said plunger to said vacuum tube to transmit the vertical movement of the plunger to the vacuum tube, said connection means including a sleeve through which said plunger slides, means for preventing relative rotational movement between the plunger and the sleeve, said sleeve also being slidably mounted for reciprocal movement within said heater, means for preventing relative rotational movement of the sleeve with respect to the heater means including a keyway in said sleeve and a flexible, substantially U-shaped spring mounted with respect to said heater means and extending into said keyway to effect said prevention of relative movement between the sleeve and heater means without close tolerances between the spring and the keyway since the spring, due to its resiliency, fills the keyway.

30. A device as in claim 29 including means for limiting the vertical movement of the plunger within the sleeve between first and second positions, means for normally biasing the plunger to its raised, first position and second biasing means for biasing the vacuum tube to a raised position within the heater means, said second biasing means being weaker than the first whereby, upon depression of the plunger within the sleeve, the second biasing means is compressed to quickly lower the vacuum tube toward the lower end of the heater means until the plunger reaches its second position within the sleeve, at which time, upon further depression of the plunger, the sleeve moves with the plunger and the first spring is compressed to provide the operator with precise control over the vacuum tube while engaging the modular semiconductor component.

31. A device for attaching modular electronic components to or removing them from a substrate where each component has a plurality of terminals disposed at the periphery thereof, said device comprising:
heater means having at least one passage extending therethrough for heating a fluid flowing through said passage;
means for passing the heated fluid from said passage to the terminals of the component to effect melting of solder or the like thereat;
moving means for moving said heater means between a first, operative position over the substrate so that the solder may be melted and a second inoperative positioned removed from the substrate; and
a component support unit for receiving modular electronic components of different sizes, the component support unit having a central axis substantially aligned with the heater means with the latter means is in its inoperative position whereby components disposed in said component support unit will be accurately aligned with the component removal-/installation means, and said component support unit is pivotally mounted such that it may be pivoted away from the heater means to thereby facilitate installation of a component on the component support unit when the heater unit is in its inoperative position.

* * * * *